(12) United States Patent
Pawlak

(10) Patent No.: US 9,793,384 B2
(45) Date of Patent: Oct. 17, 2017

(54) TUNNELING FIELD EFFECT TRANSISTOR AND METHODS OF MAKING SUCH A TRANSISTOR

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 14/503,587

(22) Filed: Oct. 1, 2014

(65) Prior Publication Data
US 2016/0099343 A1 Apr. 7, 2016

(51) Int. Cl.
| | |
|---|---|
| H01L 21/8234 | (2006.01) |
| H01L 29/417 | (2006.01) |
| H01L 29/66 | (2006.01) |
| H01L 29/78 | (2006.01) |
| H01L 29/165 | (2006.01) |
| H01L 29/205 | (2006.01) |
| H01L 29/08 | (2006.01) |
| H01L 29/10 | (2006.01) |

(52) U.S. Cl.
CPC .... *H01L 29/66977* (2013.01); *H01L 29/0847* (2013.01); *H01L 29/1037* (2013.01); *H01L 29/165* (2013.01); *H01L 29/205* (2013.01); *H01L 29/66522* (2013.01); *H01L 29/66545* (2013.01); *H01L 29/66666* (2013.01); *H01L 29/7827* (2013.01); *H01L 29/7848* (2013.01); *H01L 21/823418* (2013.01); *H01L 29/41783* (2013.01)

(58) Field of Classification Search
CPC ..... H01L 21/823431; H01L 21/823418; H01L 29/66545; H01L 21/823814; H01L 29/41783
See application file for complete search history.

(56) References Cited

U.S. PATENT DOCUMENTS

2008/0079060 A1* 4/2008 Zhu .................. H01L 21/28273
257/321
2016/0322479 A1* 11/2016 Liu ................... H01L 29/66977

OTHER PUBLICATIONS

Kao et al., "Optimization of Gate-on-Source-Only Tunnel FETs with Counter-Doped Pockets," IEEE Transactions on Electron Devices, 59:2070-77, Aug. 2012.
(Continued)

*Primary Examiner* — Davienne Monbleau
*Assistant Examiner* — Leslie Pilar Cruz
(74) *Attorney, Agent, or Firm* — Amerson Law Firm, PLLC

(57) ABSTRACT

One illustrative method of forming a TFET device includes forming a first semiconductor material that extends for a full length of a drain region, a gate region and a source region of the device, masking the drain region while exposing at least a portion of the gate region and exposing the source region, forming a second semiconductor material above the gate region and above the source region, forming a third semiconductor material above the second semiconductor material and above the gate region and above the source region, the third semiconductor material being doped with an opposite type of dopant material than in the first semiconductor material, masking the drain region, and forming a gate structure above at least a portion of the exposed gate region.

28 Claims, 21 Drawing Sheets

(56) References Cited

OTHER PUBLICATIONS

Verhulst et al., "Drain voltage dependent analytical model of tunnel field-effect transistors," Journal of Applied Physics, 110:024510, 2011.
Verhulst, "Tunnel field-effect transistors," IMEC Presentation, Aug. 2012.
Verreck et al., "Quantum Mechanical Performance Predictions of p-n-i-n Versus Pocketed Line Tunnel Field-Effect Transistors,".
Taiwanese First Office Action dated Apr. 11, 2017 for Taiwanese Patent Application No. 104125199, filed on Aug. 4, 2015.

* cited by examiner

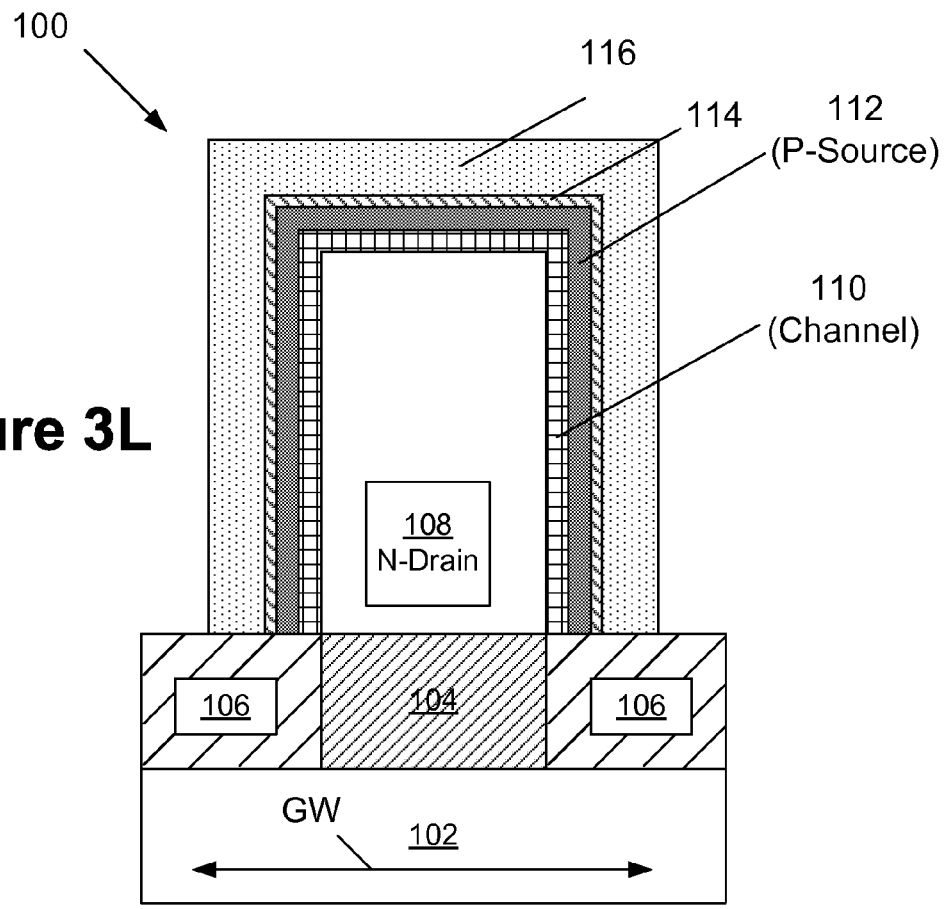
Figure 3L
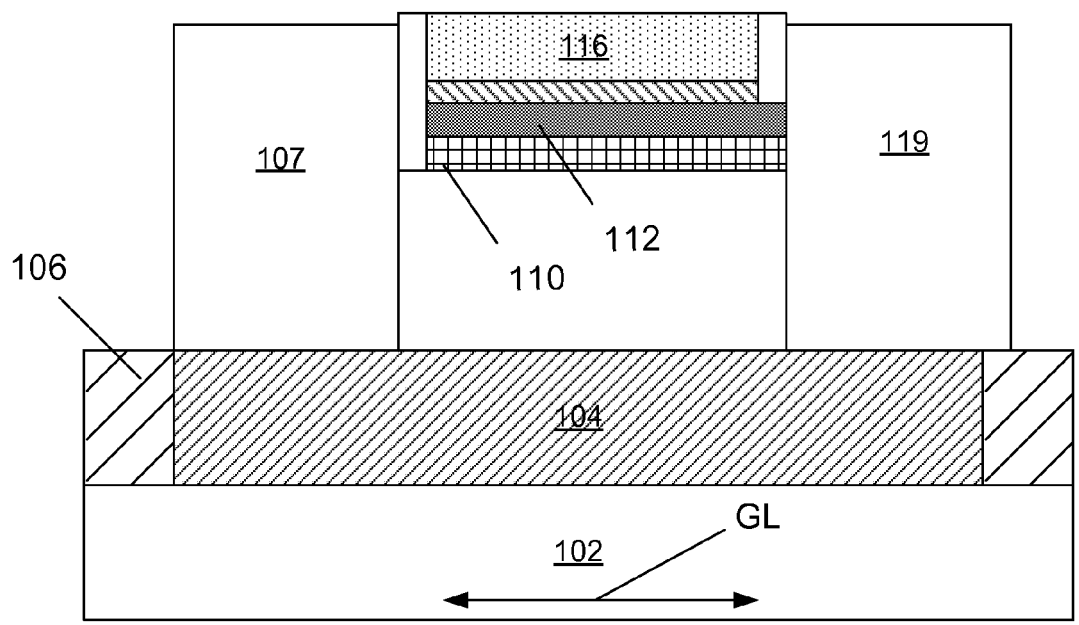

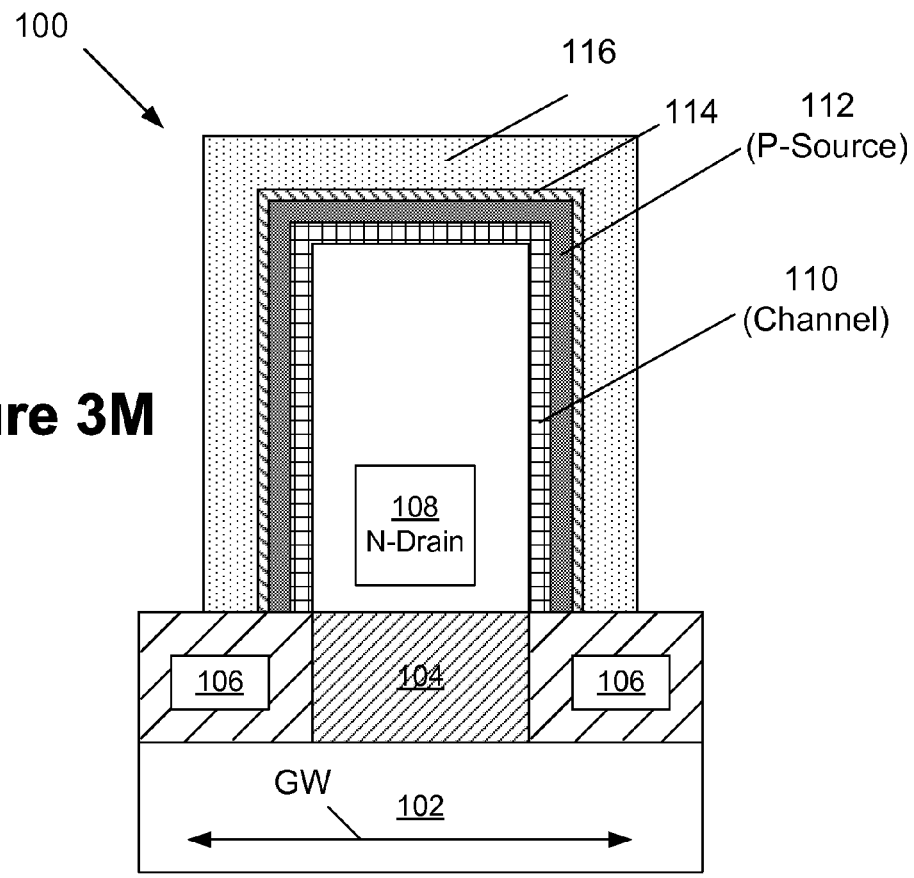
Figure 3M
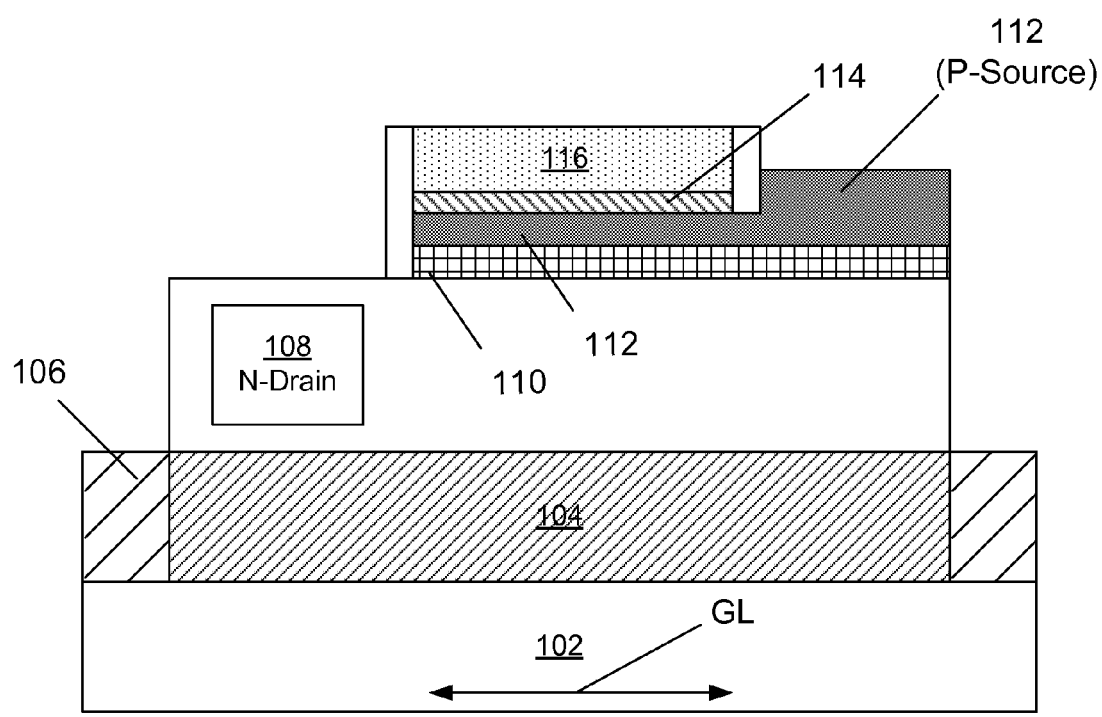

TUNNELING FIELD EFFECT TRANSISTOR AND METHODS OF MAKING SUCH A TRANSISTOR

BACKGROUND OF THE INVENTION

1. Field of the Invention

Generally, the present disclosure relates to the manufacture of FET semiconductor devices, and, more specifically, to a tunneling field effect transistor (TFET) and various methods of making such a transistor.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. So-called metal oxide field effect transistors (MOSFETs or FETs) represent one important type of circuit element that substantially determines performance of the integrated circuits. Field effect transistors can be made in a variety of different configurations, e.g., planar devices, 3D devices such as FinFETs, nanowire devices, etc. Irrespective of the configuration of the transistor device, a FET typically includes a source region, a drain region, a channel region that is positioned between the source region and the drain region, and a gate electrode positioned above or around the channel region. Drive current through the FET is controlled by setting the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is stimulated to flow between the source region and the drain region through the conductive channel region.

A planar FET is typically formed in and above an active region having a planar upper surface. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes a plurality of trenches 14 that define three illustrative fins 16, a gate structure 18, sidewall spacers 20 and a gate cap layer 22. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10. The gate structure 18 is typically comprised of a layer of gate insulating material, e.g., a layer of high-k insulating material (k-value of 10 or greater) or silicon dioxide, and one or more conductive material layers (e.g., metal, metal alloy, metal stack and/or polysilicon) that serve as the gate electrode for the device 10.

So-called tunneling field effect transistors (TFETs) are being investigated for being used in manufacturing current-day and advanced generation integrated circuit products. Relative to traditional planar and 3-D transistor devices, TFETs tend to exhibit generally much faster switching speeds, but they have major issues with the generation of sufficiently high on-state currents ($I_{on}$). FIG. 1B is a schematic depiction of an illustrative point-tunneling FET 10P.

As depicted, the device 10P is comprised of a P-doped source region 12, an N-doped drain region 14 and a channel or intrinsic region 16. The channel region 16 is typically un-doped. Also depicted are a gate insulation layer 18 and a gate electrode 20. For a point-tunneling device like device 10P, the gate electrode 20 will typically overhang the source region 12 by a distance 22 that may range from about 0-1 nm. In general, as noted above, an appropriate control voltage must be applied to the gate electrode 20 of the device 10P to establish a conductive channel whereby current may flow from the source region 12 to the drain region 14. In an ideal situation, changing a field effect transistor from an OFF-state condition to an ON-state condition would occur instantaneously and simultaneously across the entire channel length of the device. However, in a real-world device, such a conductive channel region does not form instantaneously. Rather, the conductive channel forms over a finite time period, albeit a very small time period, as the voltage is being applied to the gate electrode. It is only after a period of time that the full ON-state current of the device flows through the channel region of the device. Accordingly, FIG. 1B depicts the device 10P at a point in time where current, generally referenced with the number 24, has just started to flow in the channel region 16. More specifically, three schematically depicted lines of current 24A-24C are depicted in FIG. 1B. The current flow 24 begins with current 24A, followed by 24B, followed by 24C, etc. This process continues until such time as the device 10P is fully turned ON, and the maximum drive current 24 flows through the channel region to the drain 14.

FIG. 1C is a schematic depiction of another form of a TFET device with a different architecture—a so-called line-tunneling FET 10L. The line-tunneling FET 10L has the same basic configuration as the device 10P, except that the gate electrode 20 is positioned above the P-doped source region 12 by a distance 26 that may range from about 5-15 nm. In a line-tunneling FET 10L, while there are still point-tunneling current 24 contributions, there are mainly line-tunneling currents 28 that tunnel substantially vertically toward the gate electrode 20 in the source region and then flow toward the channel.

FIG. 1D is a graph depicting modeling results for illustrative all silicon TFET devices. More specifically, the horizontal axis is the voltage between the gate and source ($V_{gs}$) while the vertical axis is the current ($I_{ds}$) that flows through the channel region. As noted above, the conductive channel region of a real-world transistor device takes some time before it is fully formed and thus before the device is completely turned ON. Device designers use a term—sub-threshold voltage slope or swing (SS)—to characterize how long it takes for the conductive channel region to form in a field effect transistor. In general, the quicker the channel region forms, the better, as that reflects a faster switching time. FIG. 1D reflects modeling results of the sub-threshold voltage slopes for the two illustrative TFET devices 10P, 10L described above (wherein EOT=0.8 nm; $N_s=10^{20}$ cm$^{-3}$; WF=4.05 eV; and $V_{ds}$=1V). In general, the line-tunneling device 10L exhibits better switching time and a steeper SS slope than does the point-tunneling device 10P.

FIG. 1E depicts another form of field effect transistor—a vertically oriented, N-type, nanowire TFET device 30. In general, the device 30 includes a P-doped source region 34, an N-doped drain region 32 and a channel or intrinsic region 36. The channel region 36 is typically un-doped. Also depicted are a gate insulation layer 38 and a gate electrode 40. For a nanowire device like device 10P, the gate electrode 40 is positioned around the channel region 36. In some such devices, the gate electrode 40 is sized so as to overhang the source region 34 by a significant amount so as to induce line tunneling currents, as described above with respect to the device 10L.

What is needed is a TFET device that may exhibit better SS characteristics than those exhibited by the line-tunneling TFETs described above and a TFET device that is expected to produce acceptable drive current levels. Moreover, there is a need for such a TFET device that may be fabricated in a production environment where integrated circuit products are manufactured using mass production techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a tunneling field effect transistor (TFET) with a unique architecture and various methods of making such a transistor. One illustrative method disclosed herein includes, among other things, forming a first semiconductor material above a semiconductor substrate, the first semiconductor material being doped with a first type of dopant material, the first semiconductor material extending a full length of a drain region, a gate region and a source region of the device, forming a first masking layer that masks the drain region but exposes at least a portion of the gate region and exposes the source region and, with the first masking layer in position, forming a second semiconductor material above at least a portion of the gate region and above the source region. In this example the method also includes, with the first masking layer still in position, forming a third semiconductor material above the second semiconductor material and above at least a portion of the gate region and above the source region, the third semiconductor material being doped with a second type of dopant material that is opposite to the first type of dopant material, with the first masking layer in position, forming a second masking layer that masks the drain region but exposes at least a portion of the gate region, and forming a gate structure above at least a portion of the exposed gate region.

One illustrative tunneling field effect transistor device disclosed herein includes, among other things, a substrate, a body comprised of a first semiconductor material being doped with a first type of dopant material positioned above the substrate, the body having an axis that is oriented substantially perpendicular to an upper surface of the substrate, the body having two side surfaces and an upper surface, the body extending a full length of the drain region, the gate region and the source region of the device, and a second semiconductor material positioned above at least a portion of the gate region and above the source region. In this example, the device also includes a third semiconductor material positioned above the second semiconductor material and above at least a portion of the gate region and above the source region, the third semiconductor material being doped with a second type of dopant material that is opposite to the first type of dopant material, and a gate structure positioned above the first, second and third semiconductor materials in the gate region.

BRIEF DESCRIPTION OF THE DRAWINGS

The disclosure may be understood by reference to the following description taken in conjunction with the accompanying drawings, in which like reference numerals identify like elements, and in which:

FIGS. 3A-3M depict various illustrative methods of making one embodiment of a tunneling field effect transistor (TFET) disclosed herein.

Figure 1A:
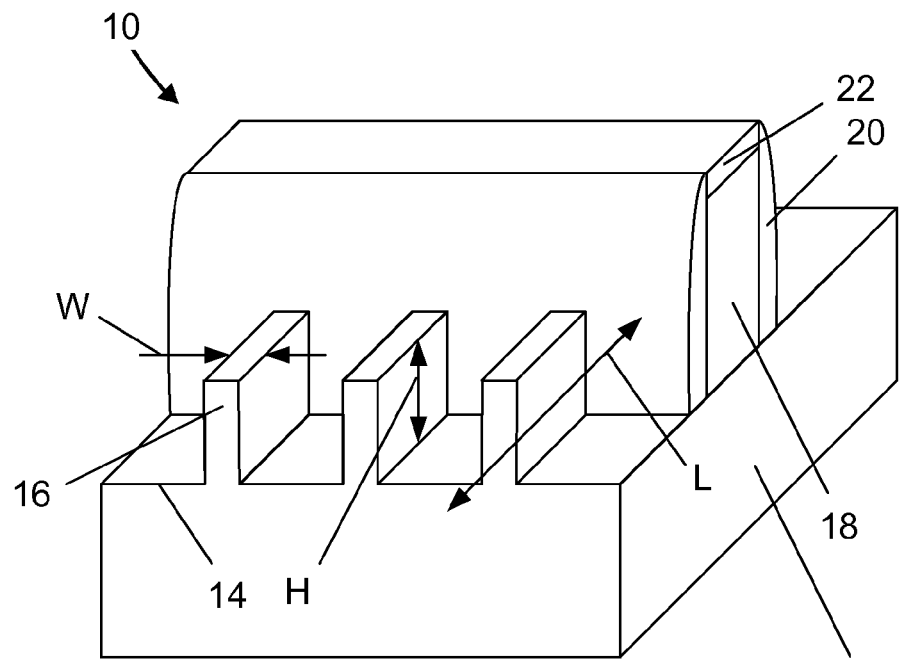
FIG. 1A is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a tunneling field effect transistor (TFET) with a unique concentric architecture and various methods of making such a transistor. As will be readily apparent to those skilled in the art upon a complete reading of the present application, the present method is applicable to a variety of devices, including, but not limited to, logic devices, memory devices, etc., and the methods disclosed herein may be employed to form N-type or P-type TFET devices. With reference to the attached figures, various illustrative embodiments of the methods and devices disclosed herein will now be described in more detail.

FIGS. 2A-2F depict one illustrative embodiment of a tunneling field effect transistor (TFET) disclosed herein. In one embodiment, the illustrative TFET device 100 will be formed in and above the semiconductor substrate 102, having a bulk configuration. The TFET device 100 may be either an NMOS or a PMOS transistor. The gate structure of the TFET device 100 may be formed using either so-called "gate-first" or "replacement gate" ("gate-last") techniques. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

Figure 1D:
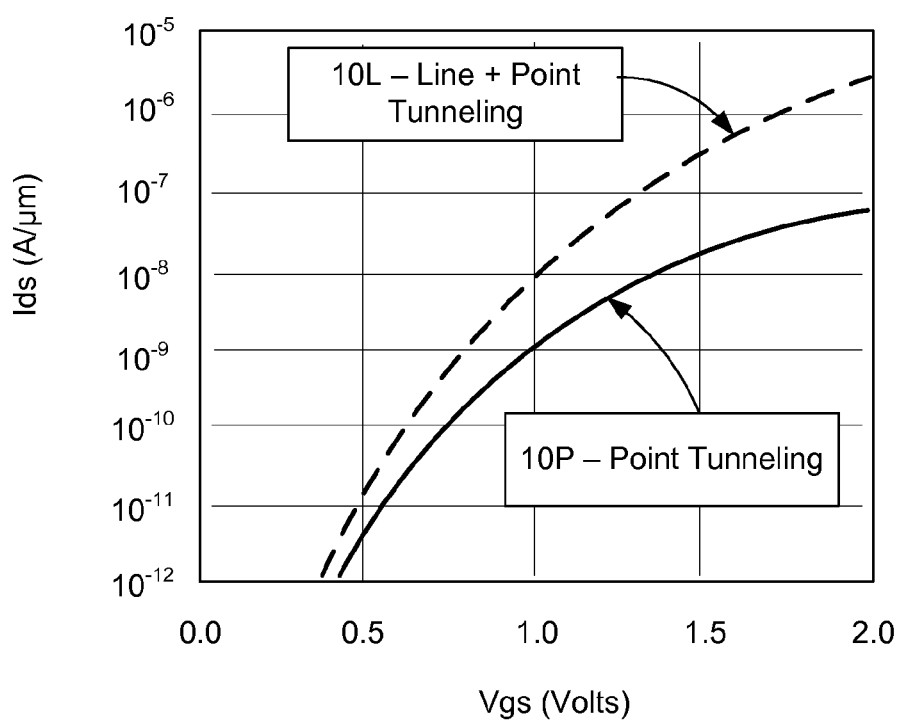
FIG. 1D is a chart depicting SS characteristics of prior art TFET devices.
Figure 1B:
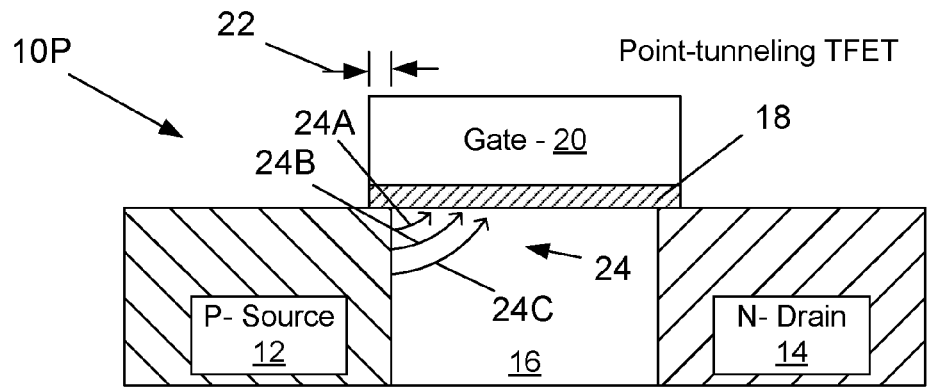
FIGS. 1B-1C are cross-sectional views of schematically depicted prior art TFET devices.
Figure 1C:
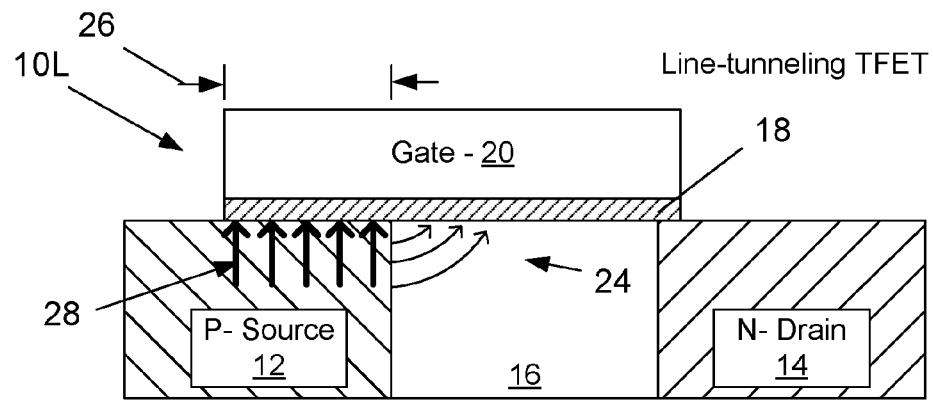
Figure 1E:
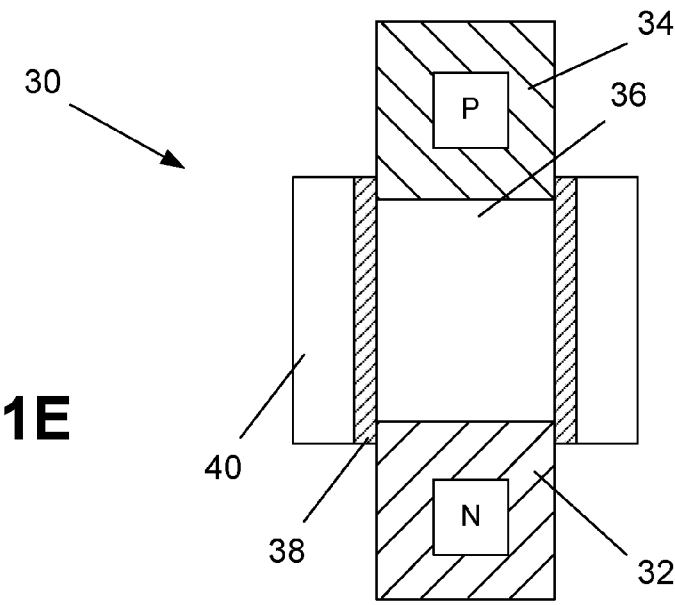
FIG. 1E is a cross-sectional view of a schematically depicted prior art nanowire TFET device.
Figure 2A:
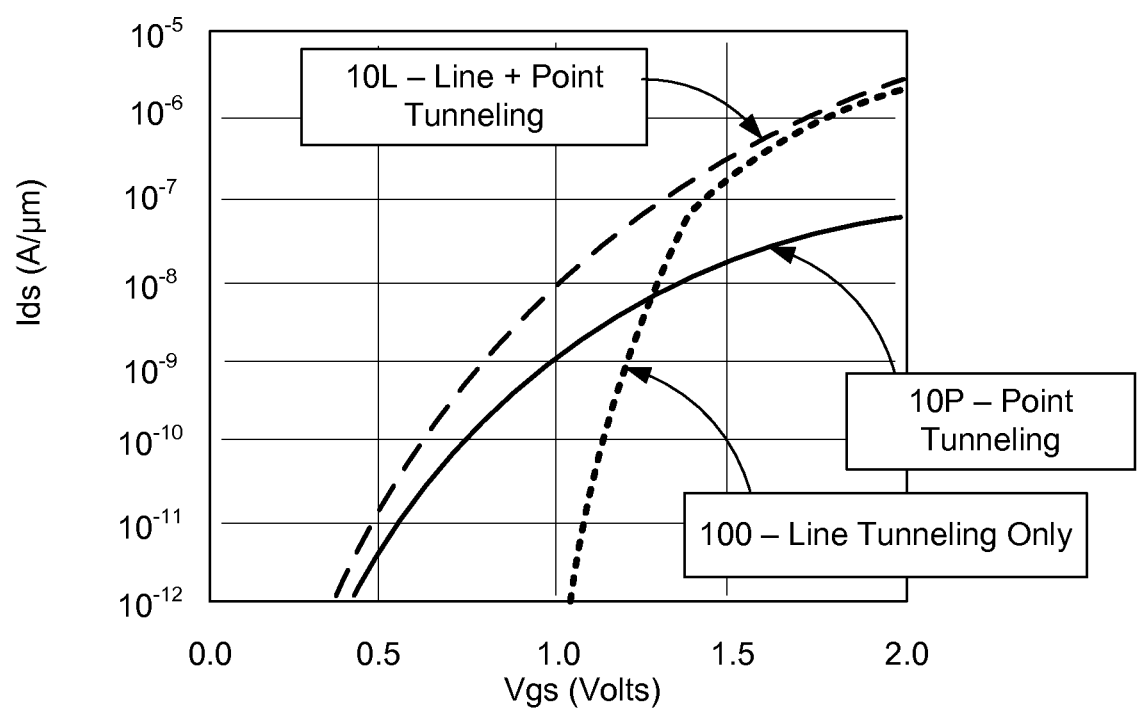
FIGS. 2A-2F depict one illustrative embodiment of a tunneling field effect transistor (TFET) with a unique architecture as disclosed herein.

FIG. 2A is a graph showing the SS characteristics (based upon modeling) of the novel TFET device 100 disclosed herein as compared to the devices 10P and 10L disclosed in the background section of this application. FIG. 2A is the same as FIG. 1D except that the line showing the results for the TFET device 100 disclosed herein has been added. As depicted, the TFET device 100 exhibits significantly improved SS characteristics relative to the devices 10P and 10L. More specifically, as will be described more fully below, the TFET device 100 disclosed herein is fabricated and configured such that only line-tunneling currents are present in the device 100, i.e., the point tunneling currents are eliminated.

Figure 2B:
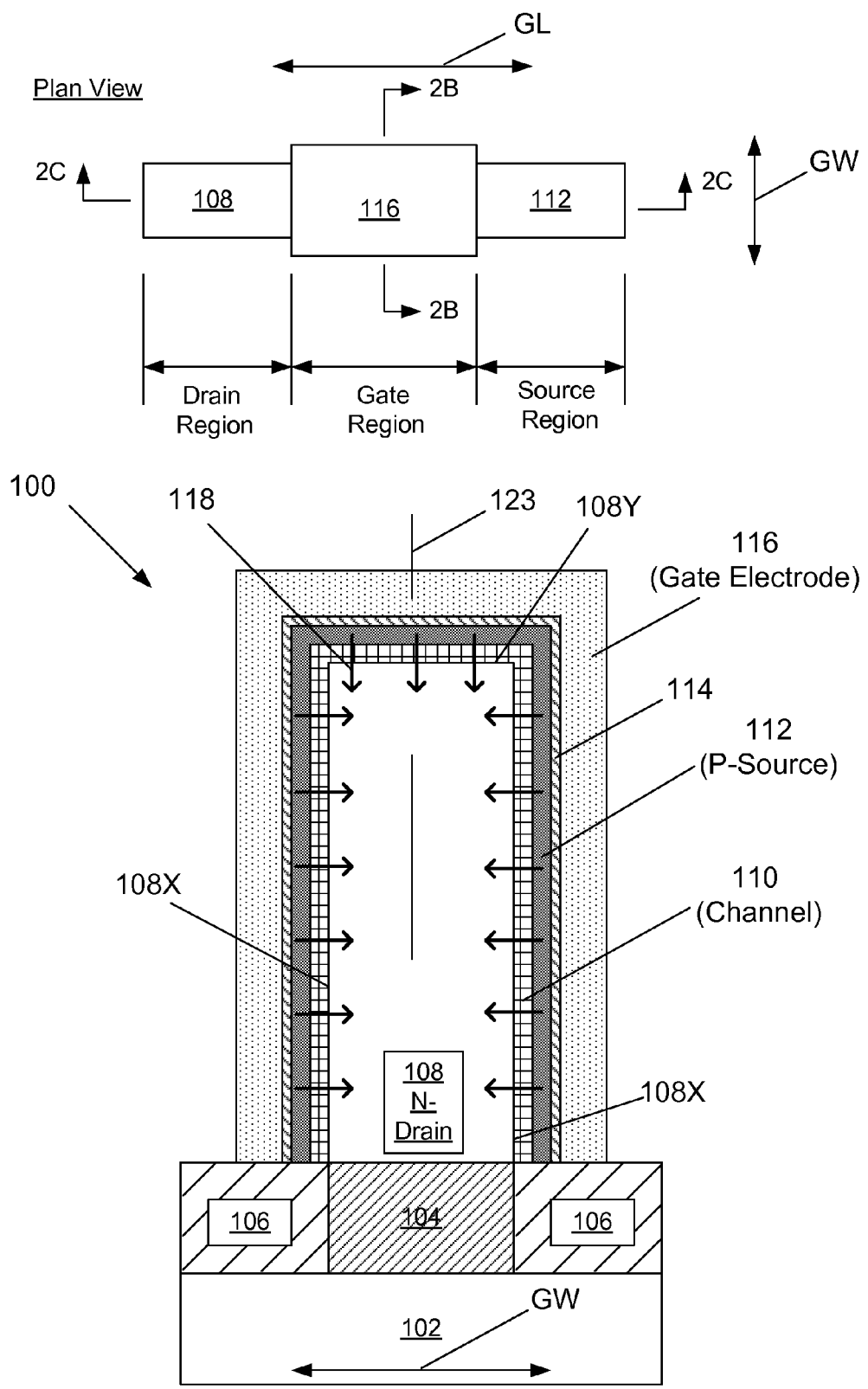
Figure 2C:
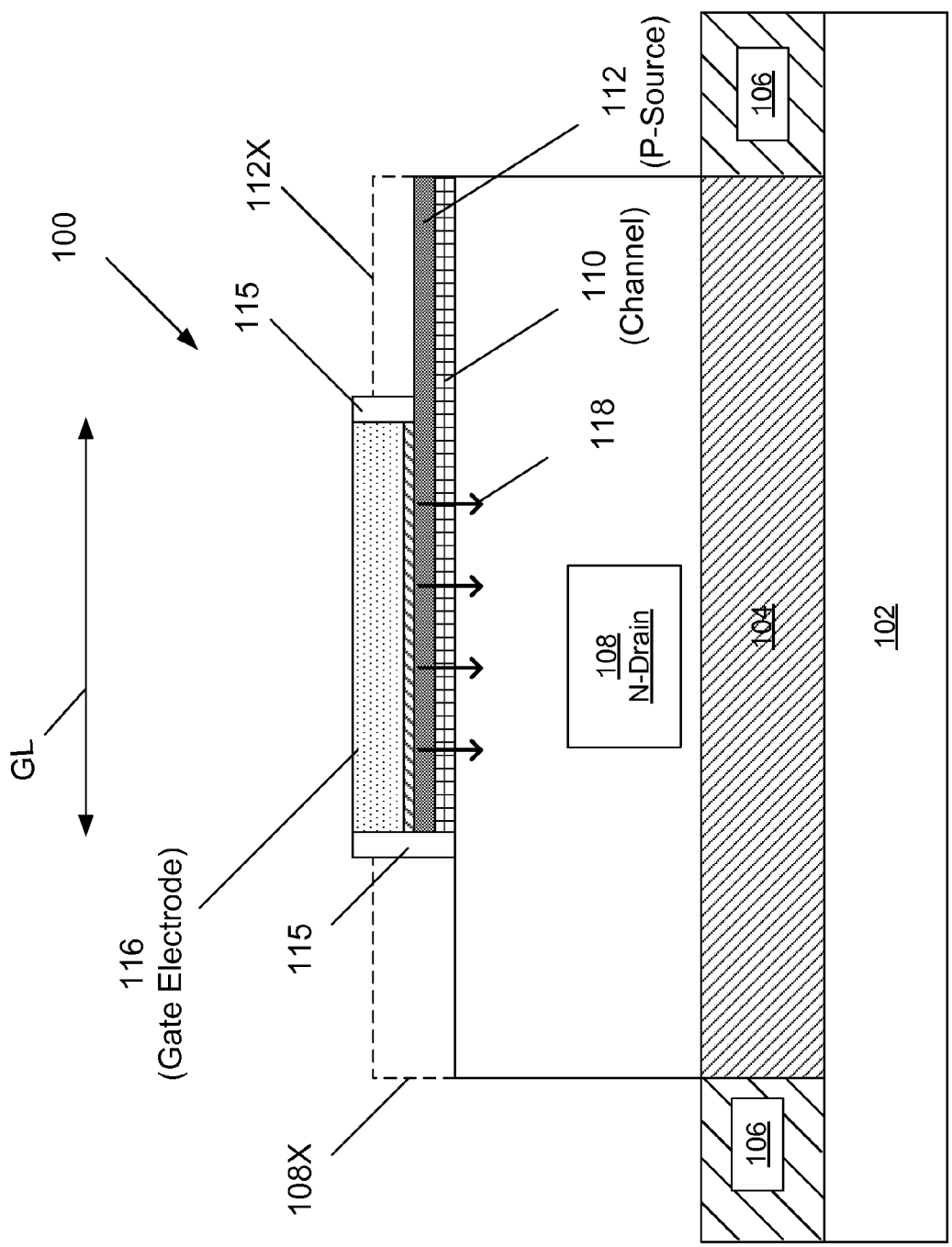
Figure 2D:
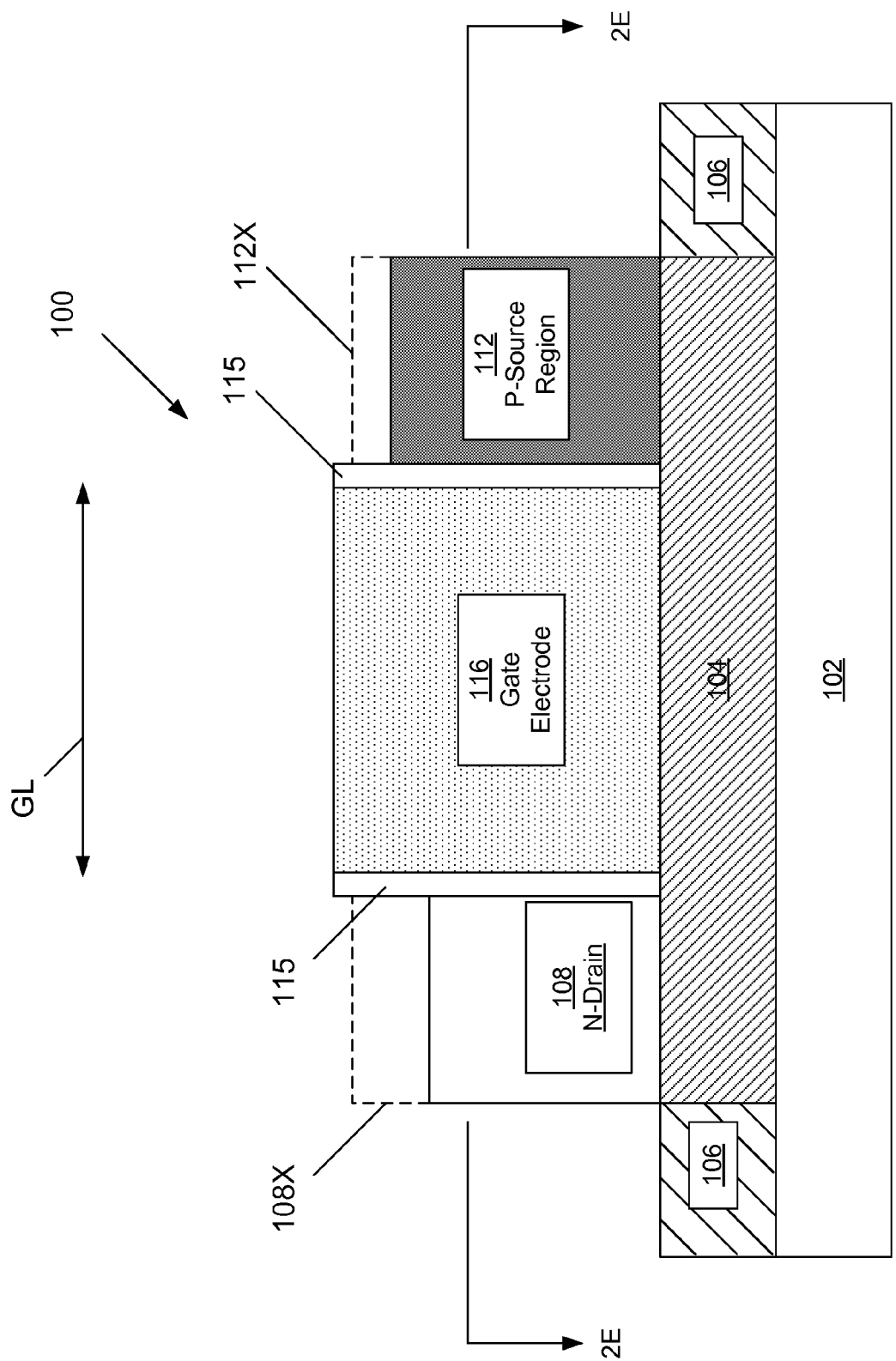
Figure 2E:
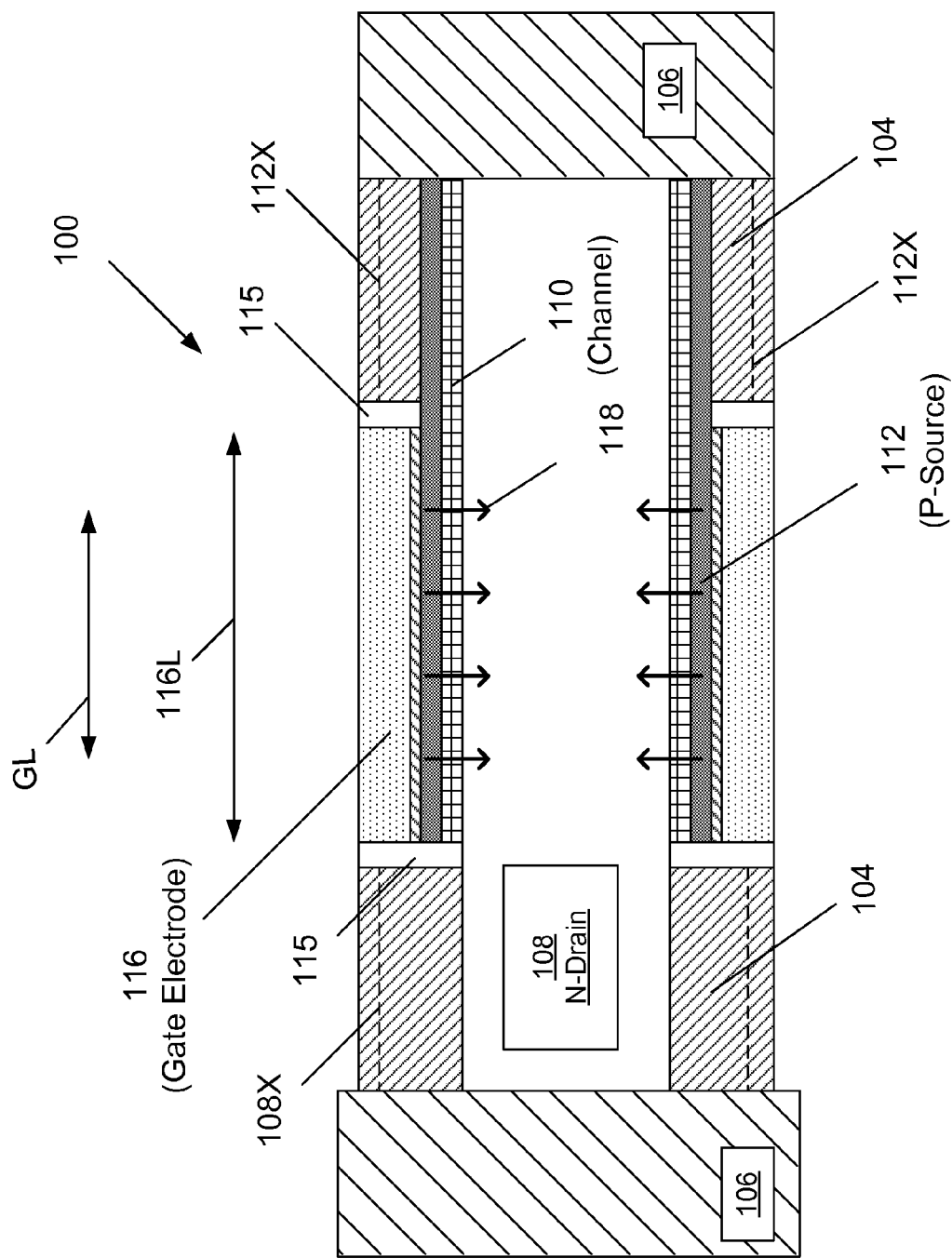
Figure 2F:
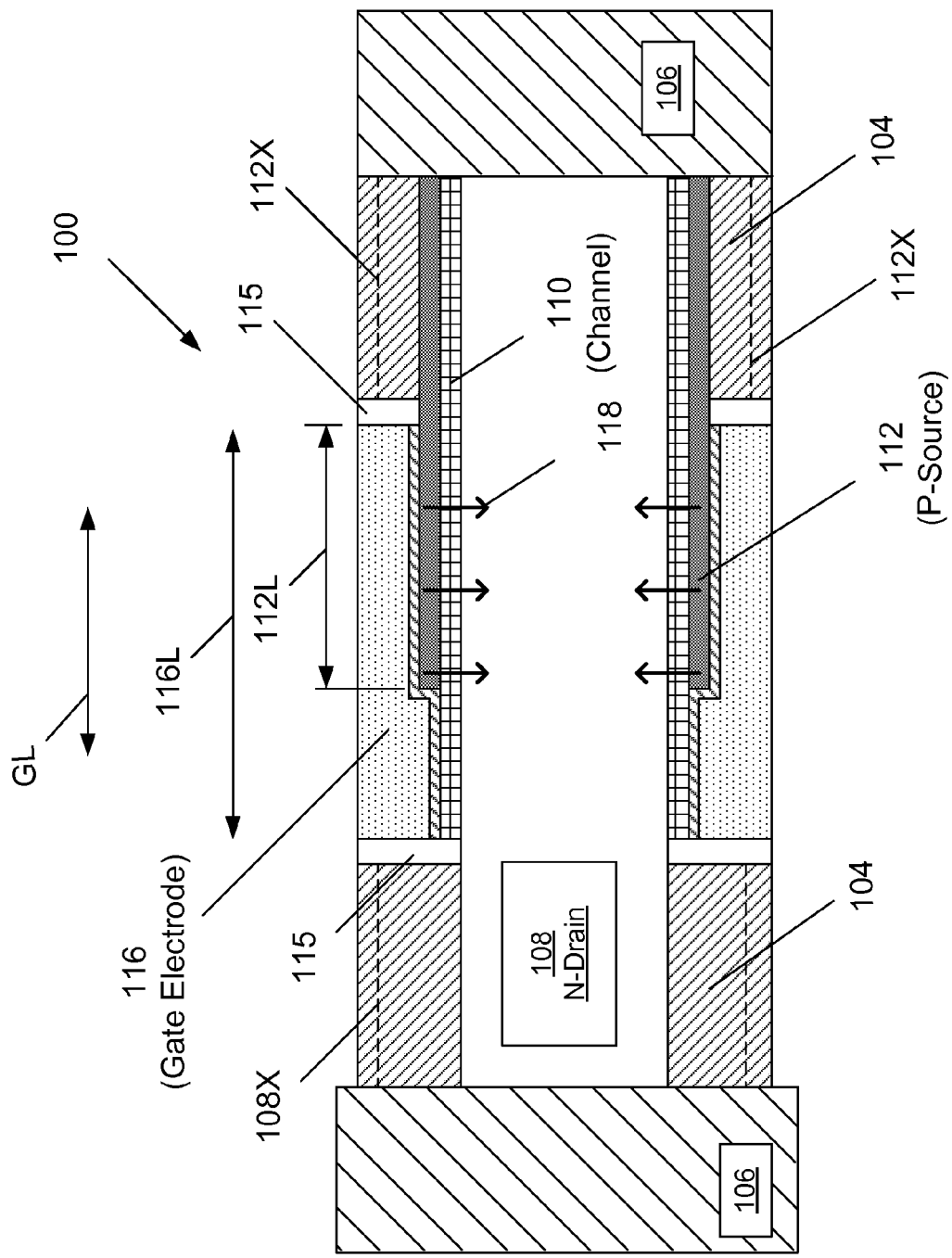

In general, the TFET device 100 disclosed herein will be manufactured such that it has a substantially fin-like structure with a height and width and a long axis that extends in the direction of current travel, i.e., the channel length direction, when the device 100 is operational. FIG. 2B contains a simplistic plan view showing general orientation of the device 100 and an N-doped drain region 108, a P-doped source region 112 and a gate electrode structure 116. The gate length (GL) and gate-width (GW) directions of the device 100 are also depicted. As indicated, the TFET device 100 generally has a drain region, a gate region and a source region. FIG. 2B also contains an enlarged cross-sectional view of the device 100 taken through the channel region of the device 100 in a gate-width direction (GW); FIG. 2C is an enlarged cross-sectional view of the device 100 taken through the channel region of the device 100 in a gate-length direction (GL); FIG. 2D is a side view of the device 100; FIG. 2E is a cross-sectional view of the device 100 taken where indicated in FIG. 2D; and FIG. 2F is a cross-sectional view of a possible alternative embodiment of the device 100.

With reference to FIGS. 2B and 2C in particular, the illustrative TFET device 100 disclosed herein is comprised of an N-doped drain region 108, a channel region (sometimes referred to as an intrinsic region) 110, a P-doped source region 112, a gate insulation layer 114 and a conductive gate electrode 116. Also depicted are schematic line tunneling currents 118. The N-doped drain region 108 defines a body for the device 100 that has an axis 123 that is oriented substantially perpendicular to an upper surface of the substrate 102. It should also be noted that the N-doped drain region 108 body has two side surfaces 108X and an upper surface 108Y, and that the N-doped drain region 108 body extends the full length of the drain region, the gate region and the source region of the device 100.

Due to the geometry of the TFET device 100 disclosed herein, only line tunneling currents 118 are generated in the TFET device 100. That is, the concentric architecture of the TFET device 100 disclosed herein excludes any point tunneling contributions. The N-doped drain region 108 is positioned above a band-offset buffer material 104 which is positioned between isolation materials 106, all of which are positioned above the substrate 102. The band-offset buffer material 104 also extends the full length of the drain region, the gate region and the source region of the device 100.

In one embodiment, the band-offset buffer material 104, the N-doped drain region 108, the channel region 110 and the P-doped source region 112 may each be comprised of a group III-V compound semiconductor material or a group IV material, that are formed by epitaxial deposition processes, as described more fully below. In some cases, the materials for the layers 104, 108, 110 and 112 may be doped in situ and/or via ion implantation techniques. The materials for the layers 104, 108, 110 and 112 need not all be made of the same material, although such a situation may occur in some applications. The gate insulation layer 114 may be comprised of a high-k gate insulation material (k value of 10 or greater), and the gate electrode 116 may be comprised on one or more layers of metal or metal alloys. The isolation material 106 may be comprised or, for example, silicon dioxide. With reference to FIG. 2B, in one illustrative embodiment, the N-doped drain region 108 may have a lateral thickness of about 3-4 nm, the channel region 100 may have a lateral thickness of about 1-2 nm and the P-doped source region 112 may have a lateral thickness of about 2-3 nm. In one embodiment, the N-doped drain region 108 should have a dopant concentration on the order of about $5 \times 10^{19}$-$1 \times 10^{21}$ ion/cm$^3$. The P-doped source region 112 should not be too heavily doped, i.e., it should have a dopant concentration on the order of about $5 \times 10^{18}$-$8 \times 10^{19}$ ion/cm$^3$. In general, the portions of the P-doped source region 112 positioned under the gate structure should be doped less heavily than portions of the P-doped source region 112 that are not positioned under the gate structure. The portions of the P-doped source region 112 positioned laterally outside of the gate structure may be more heavily doped (e.g., $5 \times 10^{19}$-$1 \times 10^{21}$ ion/cm$^3$) so as to increase the conductivity of heavier doped regions to reduce electrical resistance when contact is made to the heavier doped portion of the P-doped source region 112. However, for the portions of the P-doped source region 112 positioned under the gate structure, the dopant concentration should not be so high as to screen the electric field of the gate. As indicated in FIGS. 2C-2D, if desired, the size of the portions of the P-doped source region 112 and/or the N-doped drain region 108 that are positioned laterally outside of the gate structure may be individually increased in size, as reflected by the dashed lines 112X, 108X, respectively.

FIG. 2F depicts an embodiment of the TFET device 100 disclosed herein wherein the P-doped source region 112 is formed such that it does not extend laterally across the entire gate region. For example, the gate structure may have a length 116L (in the gate length direction) of about 5-30 nm, while the portion of the P-doped source region 112 that is positioned under the gate structure may have a length of about 5-30 nm. Stated another way, as compared to the overall length 116L of the gate structure, the P-doped source region 112 may only extend under the gate structure for a distance that is equal to about 50-100% of the overall length 116L of the gate structure.

Figure 3A:
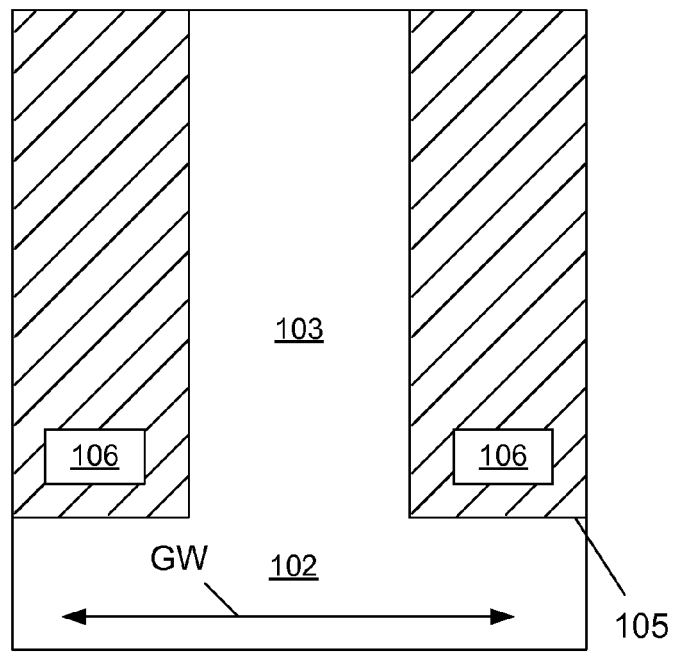
Figure 3A:
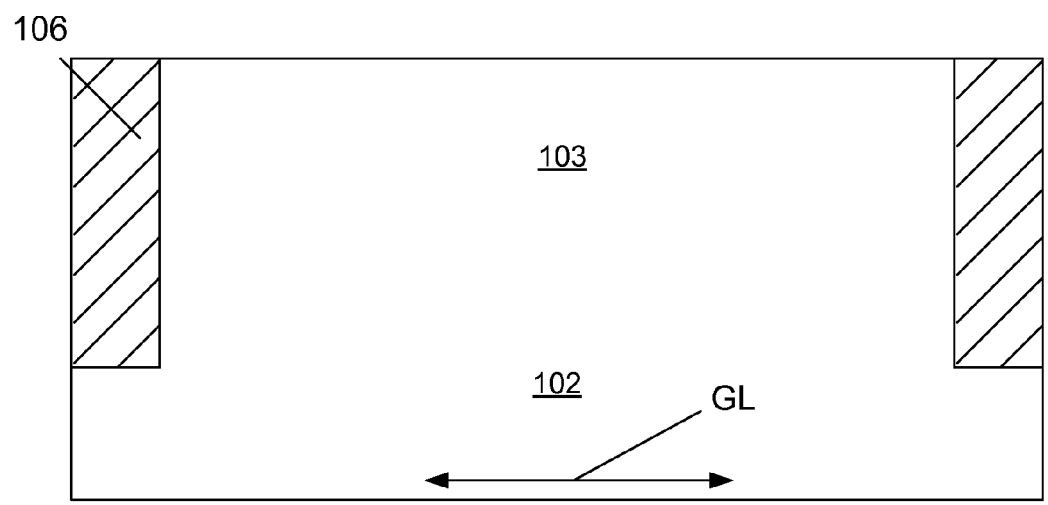

FIGS. 3A-3M depict various illustrative methods of making one embodiment of a tunneling field effect transistor (TFET) disclosed herein. FIG. 3A depicts the device 100 after several process operations were performed. First, one or more etching processes, e.g., anisotropic etching processes, were performed through a patterned etch mask (not shown), such as a patterned hard mask layer, to define a plurality of fin-formation trenches 105 in the substrate 102. The formation of the trenches 105 results in the formation of an initial fin structure 103. Thereafter, a layer of insulating material 106, such as a layer of silicon dioxide, was formed in the trenches 105. In one illustrative embodiment, the layer of insulating material 106 may be formed by blanket depositing the layer of insulating material across the device so as to over-fill the trenches 105, and thereafter performing one or more chemical mechanical polishing (CMP) processes to planarize the upper surface of the layer of material 106 with the upper surface of the fin 103, which removes the patterned masking layer used when etching the trenches 105. The overall size, shape and configuration of the fin-formation trenches 105 and fin 103 may vary depending on the particular application. In the attached figures, the fin-formation trenches 105 are depicted as having been formed by performing an anisotropic etching process that results in the fin-formation trenches 105 having a schematically depicted, generally rectangular configuration. In an actual real-world device, the sidewalls of the fin-formation trenches 105 may be somewhat inwardly tapered, although that configuration is not depicted in the attached drawings. In some cases, the fin-formation trenches 105 may have a reentrant profile (not shown) near the bottom of the fin-formation trenches 105. To the extent the fin-formation trenches 105 are formed by performing a wet etching process, the fin-formation trenches 105 may tend to have a more rounded configuration or non-linear configuration as compared to the generally rectangular configuration of the fin-formation trenches 105 that are formed by performing an anisotropic etching process. Thus, the size and configuration of the fin-formation trenches 105, and the manner in which they are made, as well as the general configuration of the fin 103, should not be considered a limitation of the present invention. For ease of disclosure, only the substantially rectangular fin-formation trenches 105 and fin 103 will be depicted in the subsequent drawings. The width and height of the fin structure 103 as well as the depth of the trenches 105 may vary depending upon the particular application.

Figure 3B:
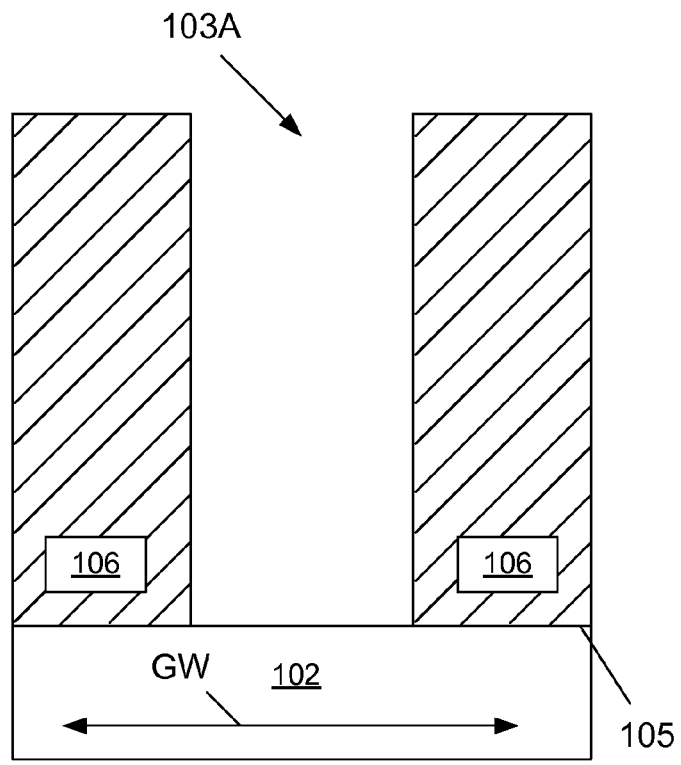
Figure 3B:
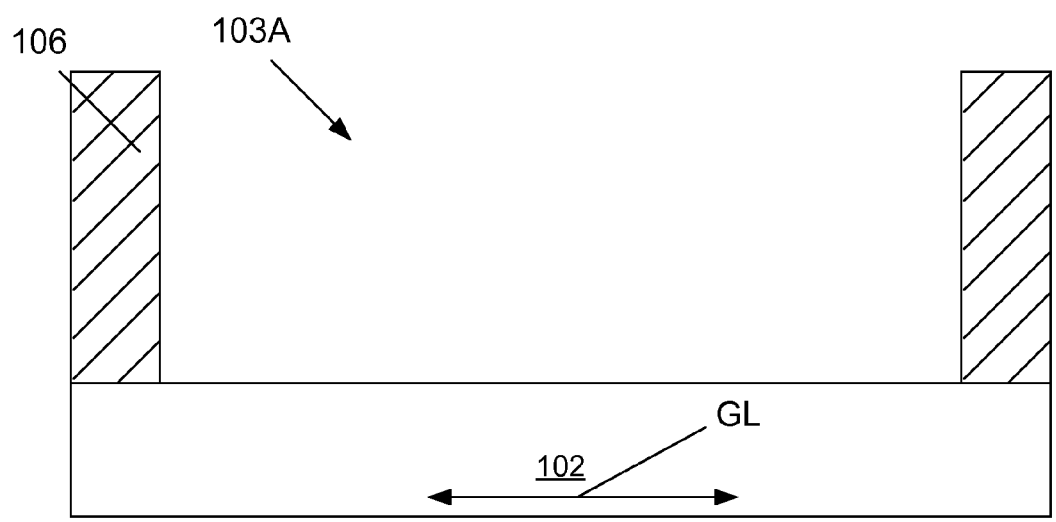

FIG. 3B depicts the device 100 after a timed etching process was performed to remove all or a portion of the fin 103 and thereby define a fin cavity 103A. Some of the semiconductor material 102 is exposed within the fin cavity 103A. It may be part of the original fin structure 103 if less than the entirety of the fin 103 was removed.

Figure 3C:
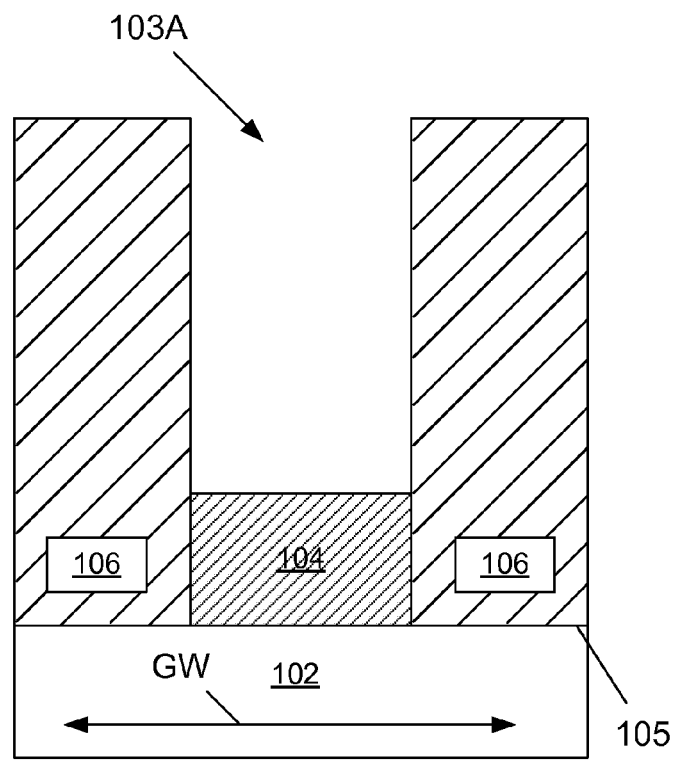
Figure 3C:
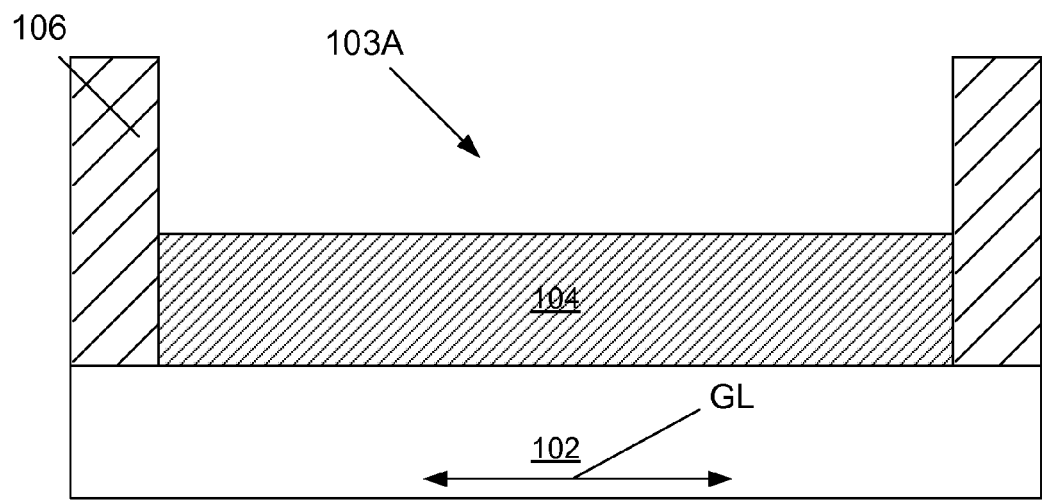

FIG. 3C depicts the device 100 after the band-offset buffer material 104 was formed in the fin cavity 103A. The vertical thickness of the band-offset buffer material 104 may vary depending upon the particular application. The band-offset buffer material 104 is provided to confine carriers within the device 100 and prevent spilling of the carriers into the substrate. The band-offset buffer material 104 may be formed by performing an epitaxial growth process using the substrate material in the fin cavity 103 as the starting or template material. The band-offset buffer material 104 may be either doped or undoped. As indicated above, the band-offset buffer material 104 is formed such that it extends the full length of the drain region, the gate region and the source region of the device 100. In one embodiment, the epitaxial growth process may be controlled such that the band-offset buffer material 104 is formed to its final desired thickness and the epi process is stopped. In another embodiment, the band-offset buffer material 104 may be grown to a thickness that is greater than its desired final target thickness and, thereafter, a recess etching process may be performed to etch the band-offset buffer material 104 to its final desired thickness. As noted above, the band-offset buffer material 104 may be comprised of a group III-V compound semiconductor material or a group IV material. In one illustrative embodiment, the band-offset buffer material 104 may be comprised of InP, GaAs, InAlAs, Si, etc. In some cases, the band-offset buffer material 104 may be omitted.

Figure 3D:
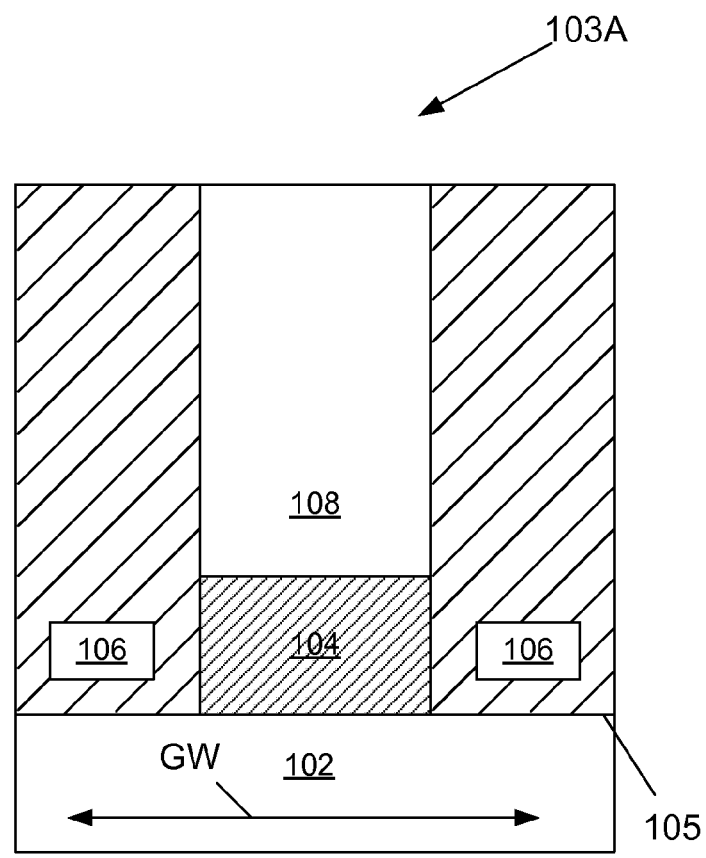
Figure 3D:
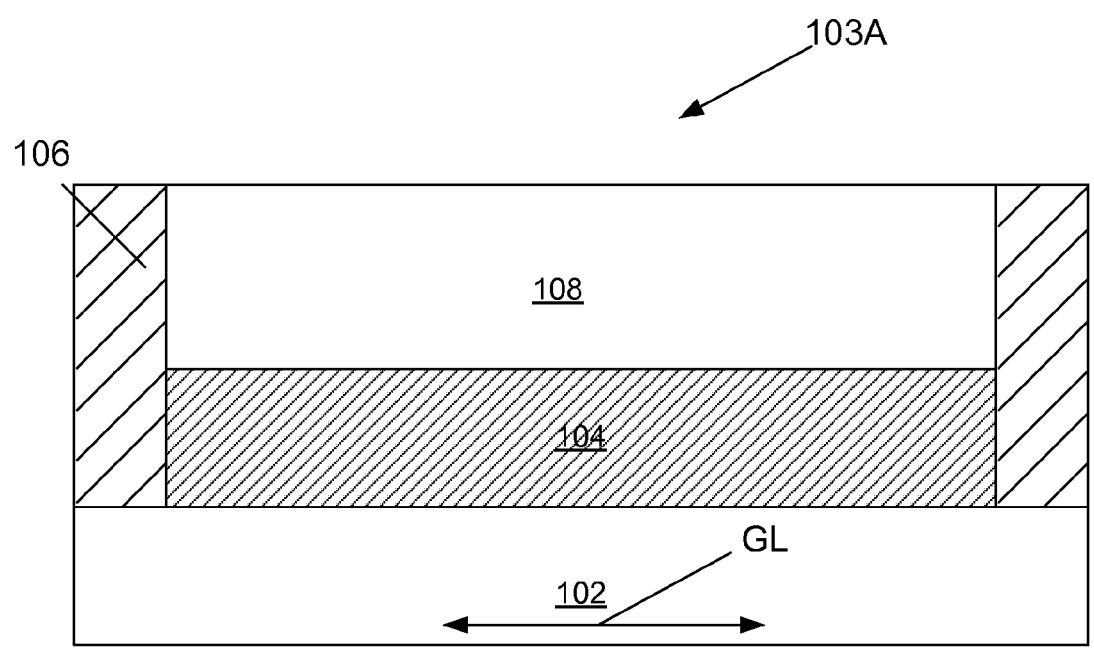

FIG. 3D depicts the device 100 after the N-doped drain region 108 material was formed in the fin cavity 103A on the band-offset buffer material 104, and after a CMP process was performed to planarize the upper surface of the N-doped drain region 108 material with the layer of insulating material 106. The N-doped drain region 108 material may be formed by performing an epitaxial growth process, and it may be in situ doped with an N-type dopant material. Of course, as will be appreciate by those skilled in the art, the illustrative TFET device 100 depicted herein is an N-type TFET device. For a P-type TFET device 100, the region 108 would be doped with a P-type dopant and the region 112 would be doped with an N-type dopant. The concentration of dopant material in the final N-doped drain region 108 material may vary depending upon the particular application. As indicated above, the N-doped drain region 108 is formed such that it extends the full length of the drain region, the gate region and the source region of the device 100. As noted above, the N-doped drain region 108 material may be comprised of a group III-V compound semiconductor material or a group IV material. In one illustrative embodiment, the N-doped drain region 108 may be comprised of InGaSb, InGaAs, InAs, etc.

Figure 3E:
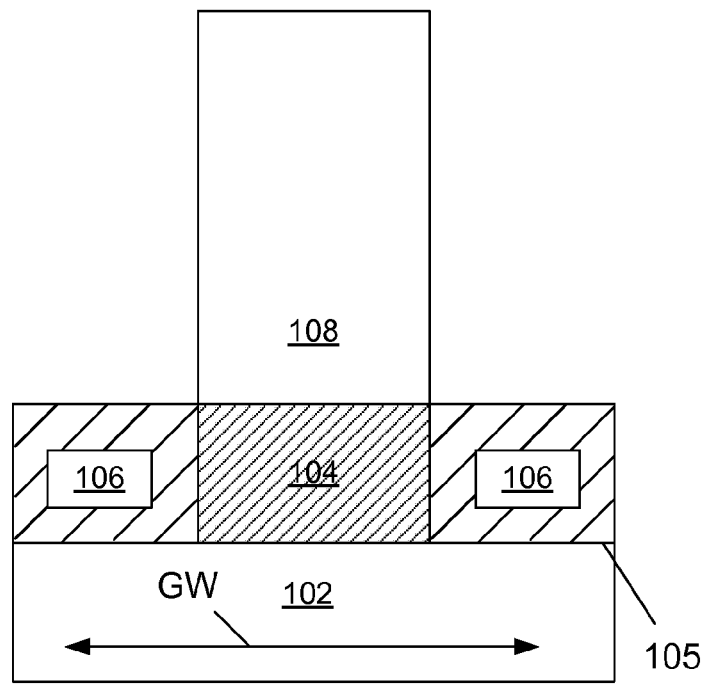
Figure 3E:
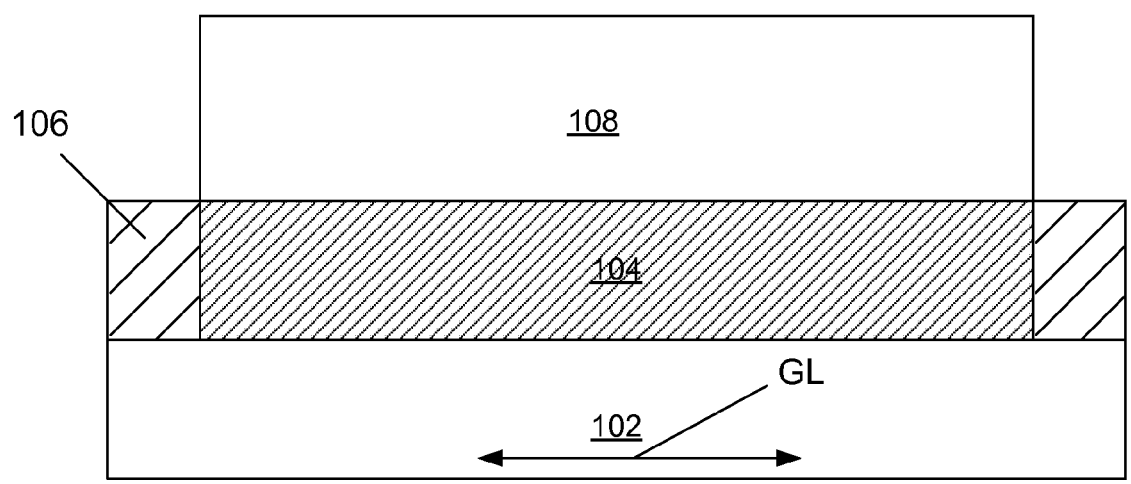

FIG. 3E depicts the device 100 after a timed, recessing etch-back process was performed on the layer of insulating material 106 to recess the upper surface of the layer of insulating material 106 to the desired height level, thereby exposing a desired amount of the N-doped drain region 108 above the recessed surface. In the depicted example, the recessing is performed such that substantially all of the vertical height of the N-doped drain region 108 is exposed, although such a situation may not occur in all applications.

Figure 3F:
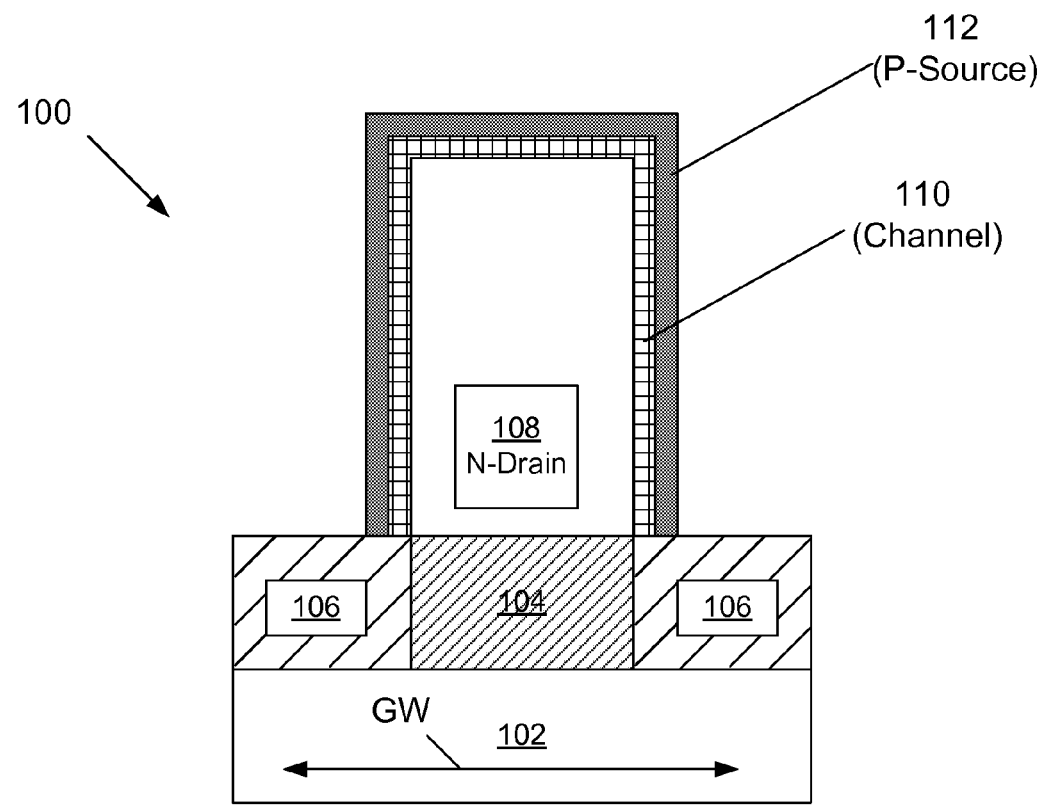
Figure 3F:
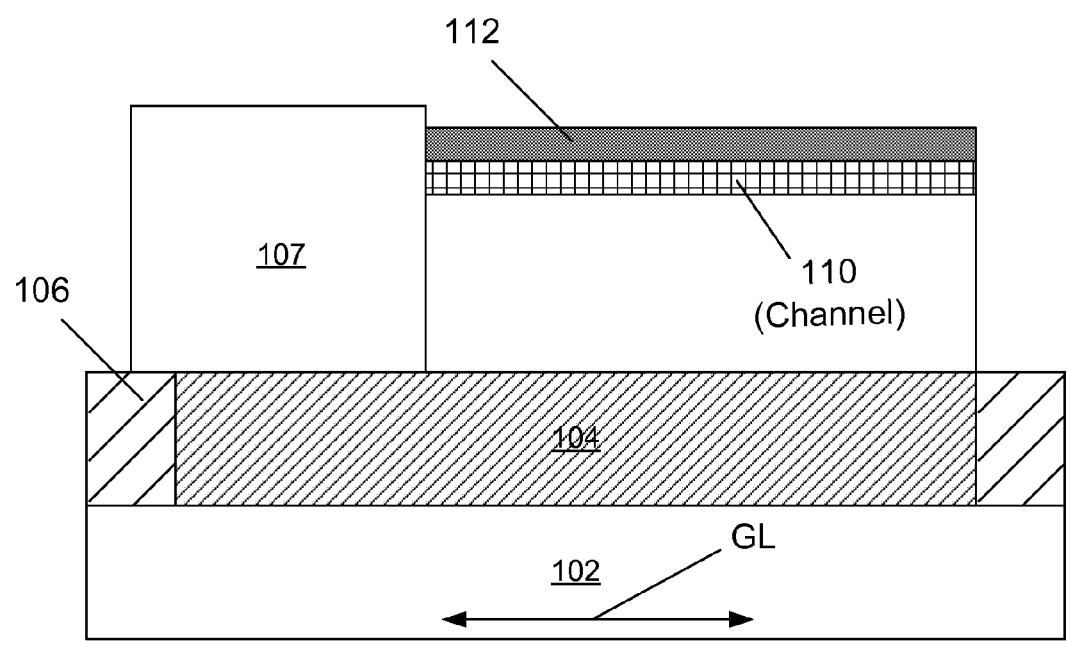

FIG. 3F depicts the device 100 after several process operations were performed. First, a patterned masking layer 107, such as a hard mask layer (e.g., silicon nitride), was formed on the device 100. The patterned masking layer 107 covers the portion of the N-doped drain region 108 in the drain region of the device 100. Next, with the drain region masked, two layers of semiconductor cladding material corresponding to the channel region 110 and the P-doped source region 112 (these layers may be collectively referred to as the "cladding layers") were sequentially formed around the exposed portion of the N-doped drain region 108 by performing known epitaxial deposition processes. In one embodiment, the channel region 110 material may be formed in an un-doped condition. As noted above, the P-doped source region 112 material may be in situ doped with a P-type dopant material. As indicated above, the dopant concentration in the portion of the P-doped source region 112 that will be positioned under the final gate structure in the gate region of the device 100 should not be too heavily doped. Of course, the concentration of dopant material in the portion of the final P-doped source region 112 that is positioned in the gate region of the device may vary depending upon the particular application. As noted above, the channel region 110 material may be comprised of a group III-V compound semiconductor material or a group IV material. In one illustrative embodiment, the channel region 110 material may be comprised of InGaAs, InAs, SiGe, etc. Additionally, as noted above, the P-doped source region 112 material may be comprised of a group III-V compound semiconductor material or a group IV material. In one illustrative embodiment, the P-doped source region 112 may be comprised of InGaSb, InGaAs, InAs, SiGe, etc.

Figure 3G:
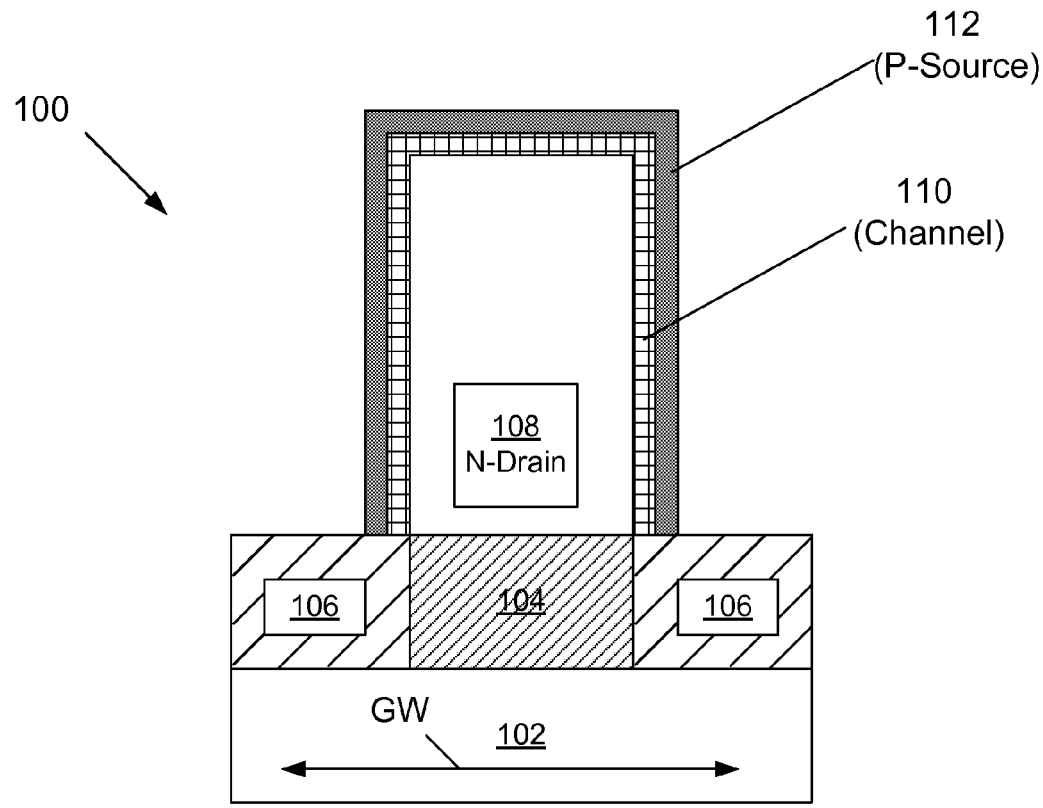
Figure 3G:
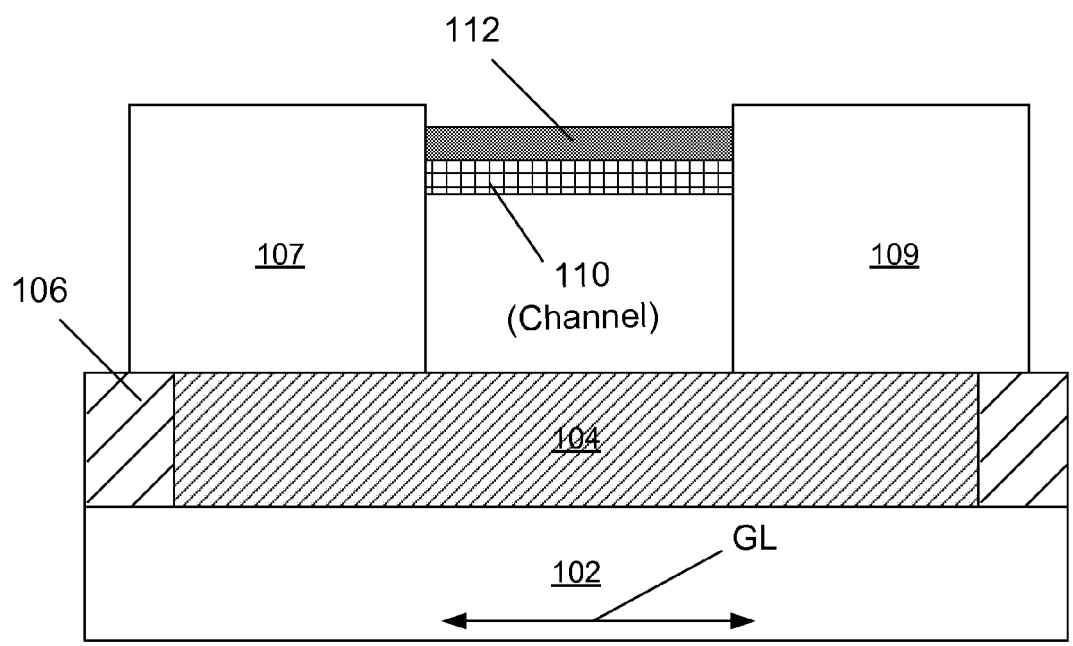

FIG. 3G depicts the device 100 after another patterned masking layer 109, such as a hard mask layer (e.g., silicon nitride), was formed on the device 100. The patterned masking layer 109 covers the source region of the device, i.e., it covers the portion of the P-doped source region 112 that will be positioned laterally outside of the gate structure of the completed device 100.

Figure 3H:
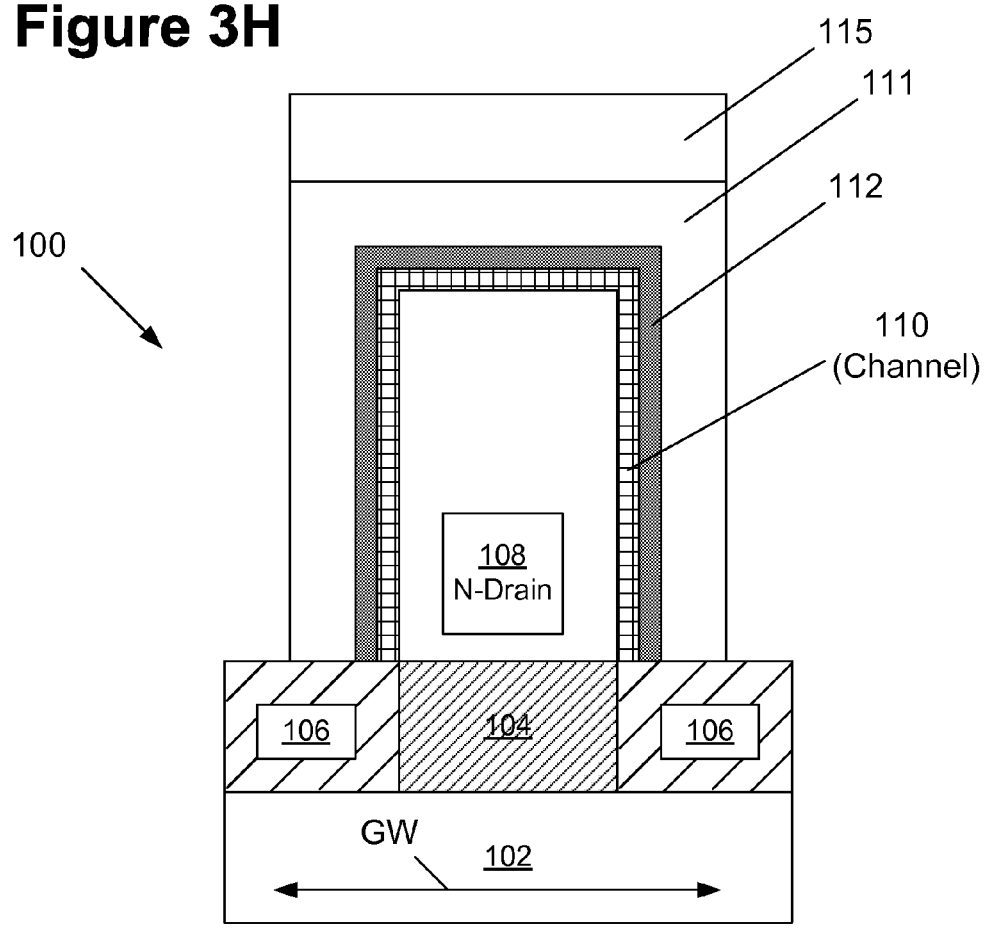
Figure 3H:
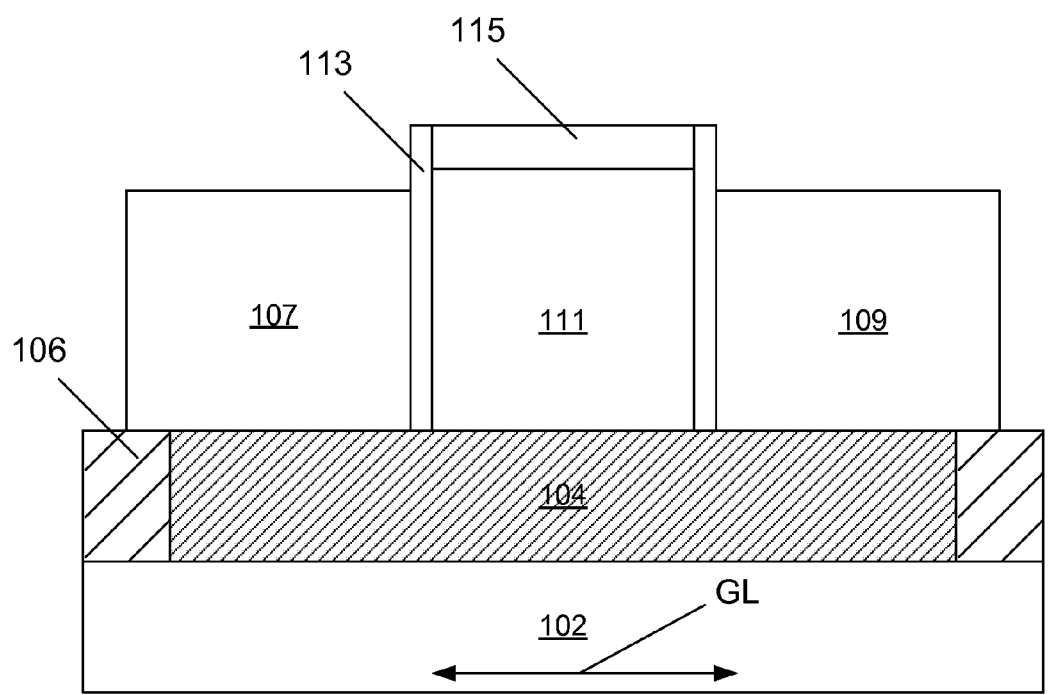

In the illustrative example depicted herein, the gate structure for the device 100 will be formed using well-known replacement gate manufacturing techniques. Accordingly, FIG. 3H depicts the device 100 after an illustrative sacrificial gate structure 111 was formed around the gate region of the device, i.e., the portions of the device not covered by the masking layers 107, 109. The bottom drawing in FIG. 3H is a side-view, not a cross-sectional view, and it is provided in an effort to simplify the presentation herein. Also depicted are illustrative sidewall spacers 113 and a gate cap layer 115. The sacrificial gate structure 111 may comprise a silicon dioxide sacrificial gate insulation layer and a sacrificial polysilicon or metal gate electrode. The manner in which such sacrificial gate structures 111, sidewall spacers 113 and gate cap layers 115 are made are well known to those skilled in the art.

Figure 3I:
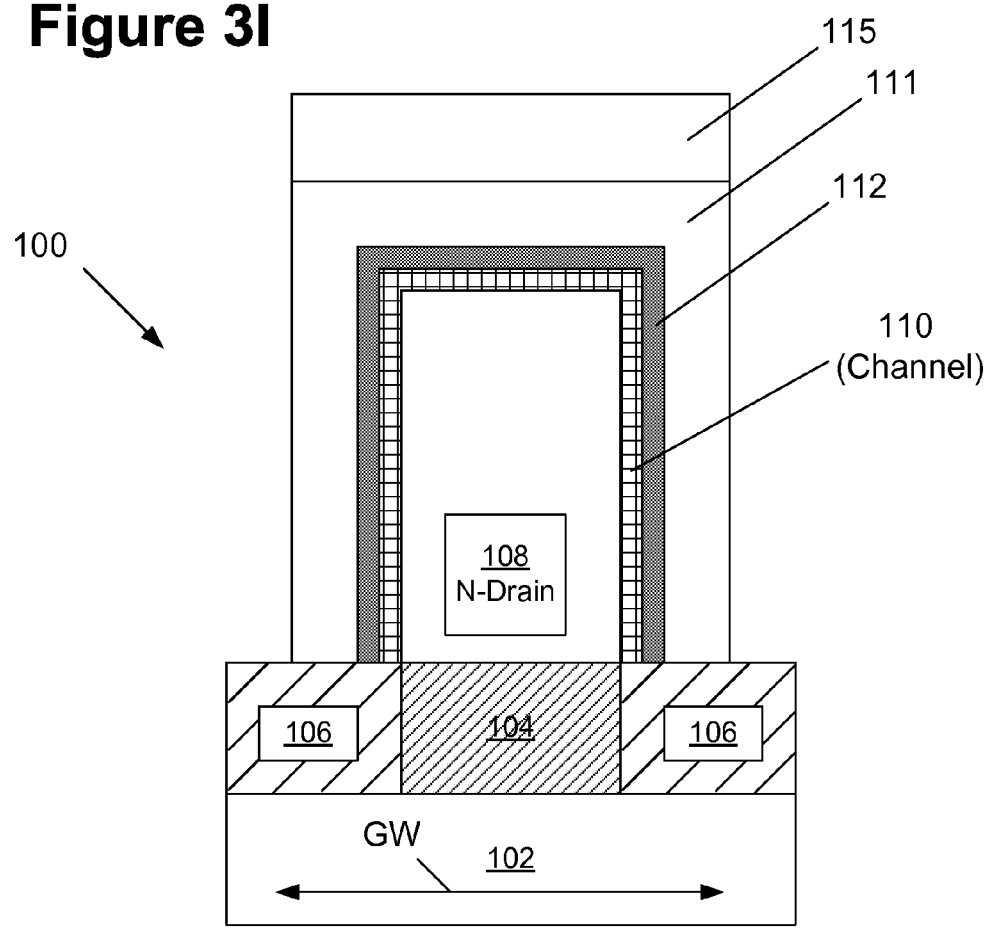
Figure 3I:
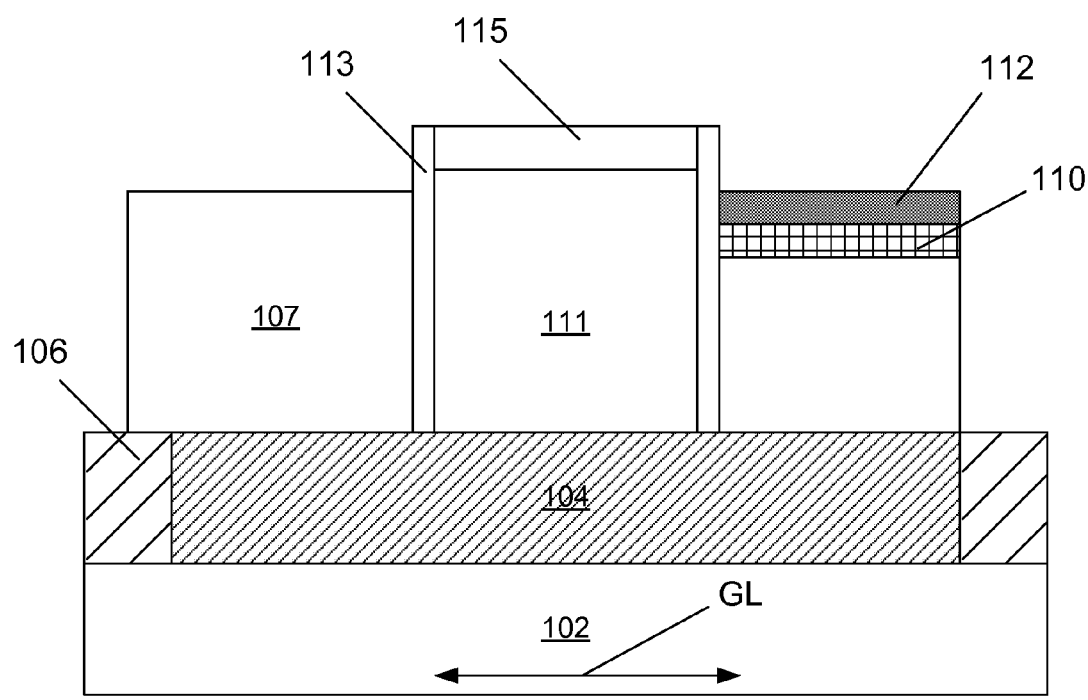

FIG. 3I depicts the device 100 after the masking layer 109 was removed. This exposes the P-doped source region 112 positioned laterally outside of the sacrificial gate structure 111.

Figure 3J:
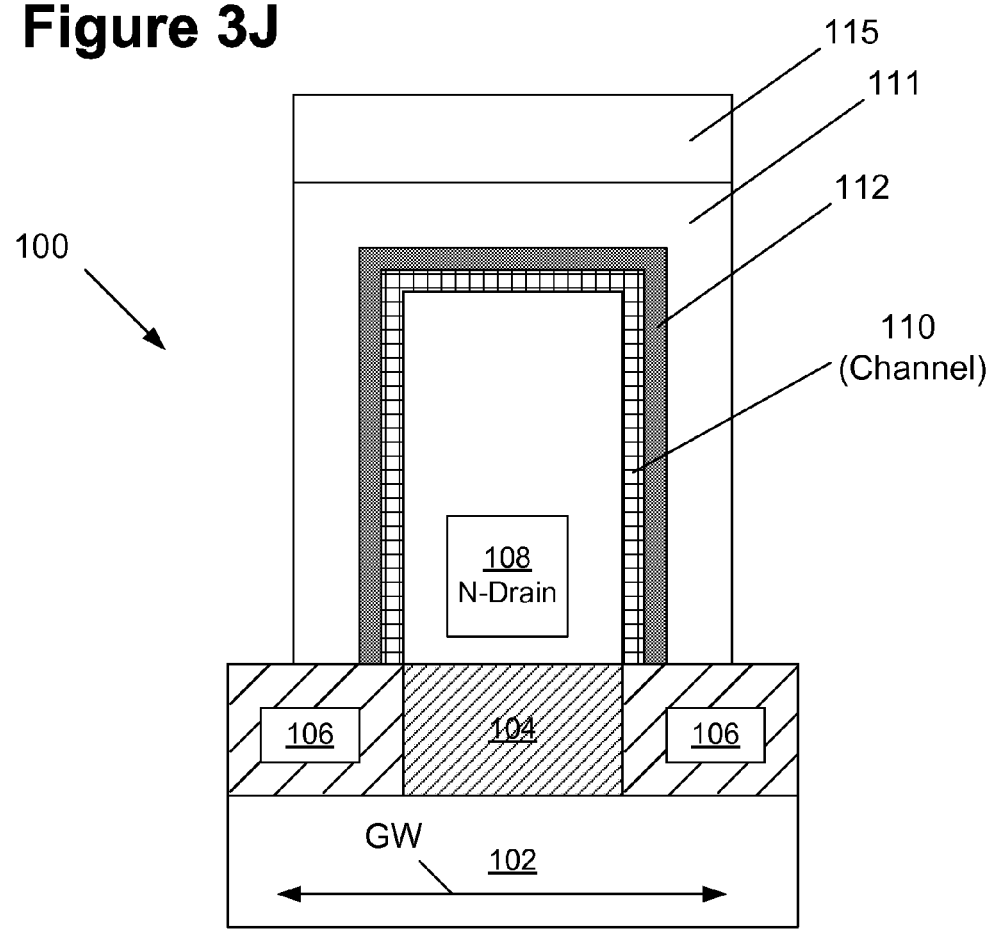
Figure 3J:
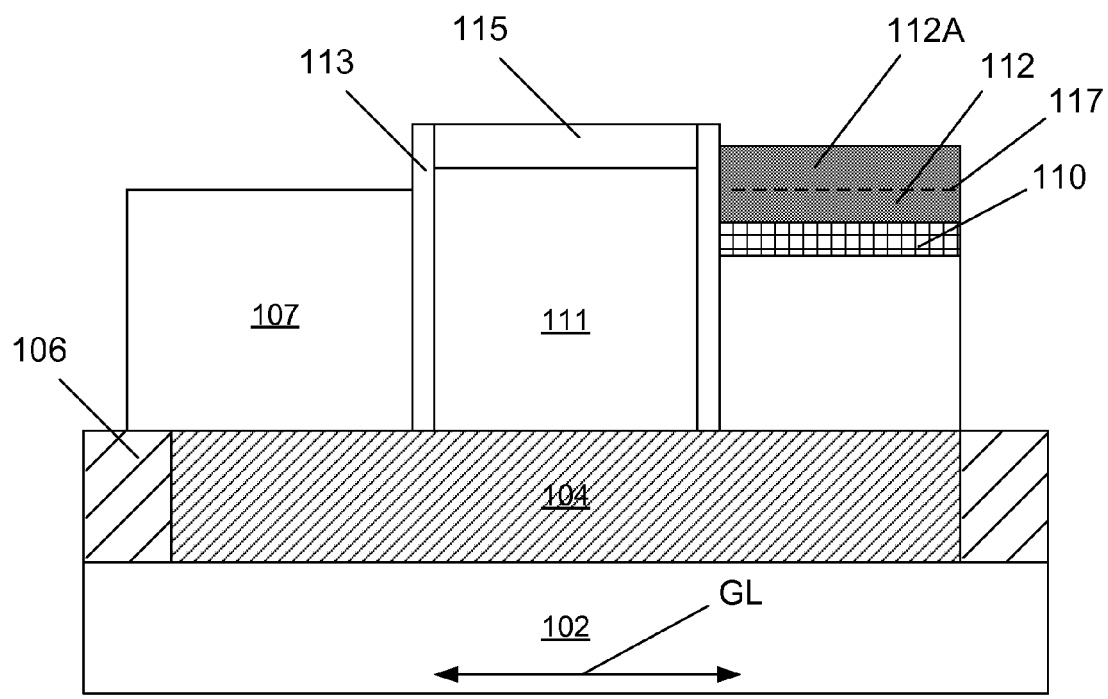

FIG. 3J depicts the device 100 after another epitaxial deposition process was performed to form additional semiconductor material 112A on the exposed portion of the P-doped source region 112 above the dashed line 117. The amount of additional epi material 112A that is formed may vary depending upon the particular application. In some embodiments, the additional semiconductor materials 112A may not even be formed. Additionally, at this point in the process flow, additional P-type dopants may be added to the exposed portion of the P-doped source region 112 via ion implantation in the case where no additional semiconductor material 112A is formed. The additional dopant material is added to increase the conductivity of this region of the device. In the case where additional material 112A is formed, the additional material 112A may be doped in situ to provide the desired level of doping. In other cases, even if the additional material 112A is formed, a separate ion implantation process may be performed to introduce additional dopant materials into this region of the device 100. Additionally, although not depicted in the attached drawings, at this point in the process flow, the masking layer 107 may also be removed to locally increase the thickness/dopant concentration of the portion of the N-doped drain region 108 covered by the masking layer 107. Of course, the P-doped source region 112 would need to be masked in such a situation.

Figure 3K:
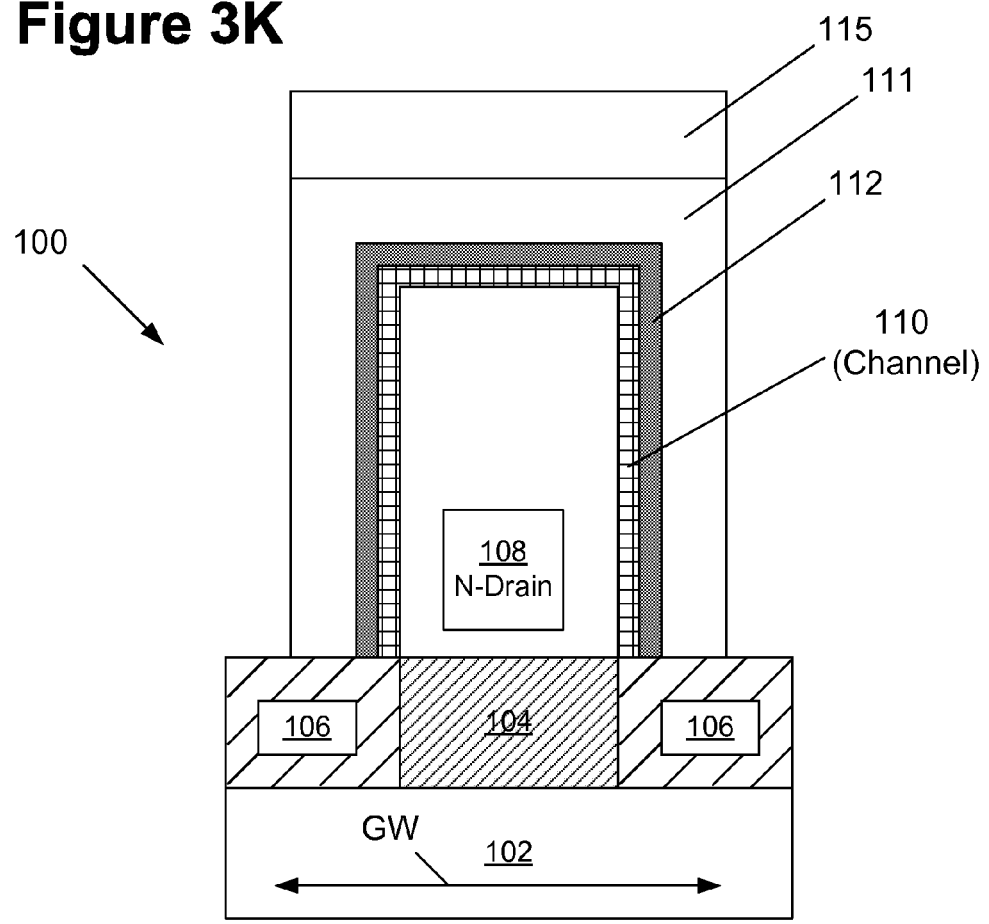
Figure 3K:
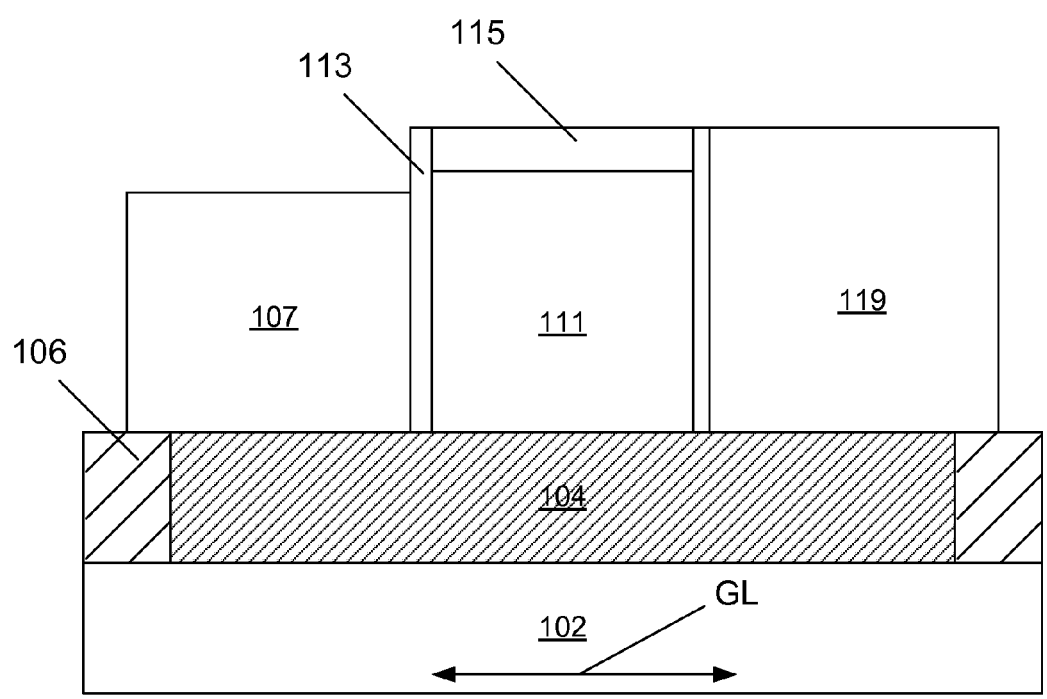

FIG. 3K depicts the device 100 after another patterned masking layer 119, such as a hard mask layer (e.g., silicon nitride), was formed on the device 100. The patterned masking layer 119 covers the portion of the P-doped source region 112 that will be positioned laterally outside of the gate structure of the completed device 100.

The next major operation involves forming the final replacement gate structure for the device 100. Accordingly, FIG. 3L depicts the product 100 after the gate cap layer 115 and the sacrificial gate structure 111 were removed, and after the above-described gate insulation material 114 and gate electrode 116 were formed on the device 100 using well-known replacement gate techniques. Note that, in this embodiment, a portion of the P-doped source region 112 is positioned under the entire gate region for the entire channel length of the device 100. As will be recognized by those skilled in the art after a complete reading of the present application, the gate structure of the device 100 depicted in the drawings, i.e., the gate insulation layer 114 and the gate electrode 116, is intended to be representative in nature. That is, the gate structure may be comprised of a variety of different materials and it may have a variety of configurations. A gate cap layer that is normally positioned above the gate electrode material 116 is not depicted. As indicated, the replacement gate structure is positioned above the first 108, second 110 and third 112 semiconductor materials in the gate region of the device 100, and it is positioned around the side surfaces 108X and the upper surface 108Y of the basic fin-like structure of the device 100.

FIG. 3M depicts the device 100 after the masking layers 107 and 119 were removed to reveal the completed TFET device 100. At this point, traditional manufacturing techniques may be performed to complete the manufacture of the device 100. For example, various contacts and metallization layers may then be formed above the device 100 using traditional techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a tunneling field effect transistor device comprising a drain region, a source region, a gate region and a gate structure, the method comprising:
   forming a first semiconductor material above a semiconductor substrate, said first semiconductor material being doped with a first type of dopant material, said first semiconductor material extending a full length of said drain region, said gate region and said source region, wherein said first semiconductor material is part of said drain region;
   forming a first masking layer that masks said drain region but exposes at least a portion of said gate region and exposes said source region;
   with said first masking layer in position, forming a second semiconductor material above at least a portion of said gate region and above said source region, wherein said second semiconductor material defines said channel region;
   with said first masking layer in position, forming a third semiconductor material above said second semiconductor material and above at least a portion of said gate region and above said source region, said third semiconductor material being doped with a second type of dopant material that is opposite to said first type of dopant material, wherein said third semiconductor material is part of said source region;
   with said first masking layer in position, forming a second masking layer that masks said drain region but exposes at least a portion of said gate region; and
   forming a gate structure above at least a portion of said exposed gate region.

2. The method of claim 1, wherein said first semiconductor material, said second semiconductor material and said third semiconductor material are each comprised of a group III-V compound semiconductor material or a group IV material.

3. The method of claim 2, wherein said first semiconductor material, said second semiconductor material and said third semiconductor material are each made of different semiconductor materials.

4. The method of claim 1, wherein forming said first semiconductor material, forming said second semiconductor material and forming said third semiconductor material comprises performing three separate epitaxial deposition processes.

5. The method of claim 1, wherein forming said second semiconductor material comprises forming said second semiconductor material such that it extends substantially across the entire gate region in a direction that corresponds to a channel length direction of said device.

6. The method of claim 1, wherein forming said second semiconductor material comprises forming said second semiconductor material in an updoped condition.

7. The method of claim 1, wherein forming said gate structure comprises forming a replacement gate structure.

8. The method of claim 1, wherein, prior to forming said second masking layer, the method comprises performing an epitaxial deposition process to form additional semiconductor material on said third semiconductor material positioned in said source region of said device.

9. The method of claim 1, wherein said first semiconductor material defines a body having an axis that is substantially perpendicular to an upper surface of said substrate, said body having two side surfaces and an upper surface.

10. The method of claim 9, wherein forming said gate structure comprises forming a gate structure that is positioned around said upper surface of said body and at least a portion of both of said side surfaces of said body.

11. The method of claim 1, wherein forming said third semiconductor material comprises forming said third semiconductor material such that is has a dopant concentration of said second dopant material that falls within the range of $5 \times 10^{18}$-$8 \times 10^{19}$ ion/cm$^3$ and wherein forming said first semiconductor material comprises forming said first semiconductor material such that is has a dopant concentration of said first dopant material that falls within the range of $5 \times 10^{19}$-$1 \times 10^{21}$ ion/cm$^3$.

12. A method of forming a tunneling field effect transistor device comprising a drain region, a source region, a gate region and a gate structure, the method comprising:
   forming a fin in a semiconductor substrate;
   removing at least a portion of said fin so as to define a fin cavity bounded, at least in part, by insulating material positioned adjacent said fin;
   forming a band-offset buffer semiconductor material within said fin cavity;
   forming a first semiconductor material on said band-offset buffer semiconductor material within said fin cavity, said first semiconductor material being doped with a first type of dopant material, said first semiconductor material extending a full length of said drain region, said gate region and said source region;
   forming a first masking layer that masks said drain region but exposes at least a portion of said gate region and exposes said source region;
   with said first masking layer in position, forming a second semiconductor material on said first semiconductor material and above at least a portion of said gate region and above said source region;
   with said first masking layer in position, forming a third semiconductor material on said second semiconductor material and above at least a portion of said gate region and above said source region, said third semiconductor material being doped with a second type of dopant material that is opposite to said first type of dopant material;
   with said first masking layer in position, forming a second masking layer that masks said drain region but exposes at least a portion of said gate region; and
   forming a gate structure above at least a portion of said exposed gate region.

13. The method of claim 12, wherein forming said second semiconductor material comprises forming said second semiconductor material such that it extends substantially across the entire gate region in a direction that corresponds to a channel length direction of said device.

14. The method of claim 12, wherein said first semiconductor material is part of said drain region, said second semiconductor material defines said channel region and said third semiconductor material is part of said source region.

15. The method of claim 12, wherein forming said second semiconductor material comprises forming said second semiconductor material in an updoped condition.

16. The method of claim 15, wherein forming said third semiconductor material comprises forming said third semiconductor material such that is has a dopant concentration of said second dopant material that falls within the range of $5 \times 10^{18}$-$8 \times 10^{19}$ ion/cm$^3$ and wherein forming said first semiconductor material comprises forming said first semiconductor material such that is has a dopant concentration of said first dopant material that falls within the range of $5\times10^{19}$-$1\times10^{21}$ ion/cm'.

17. The method of claim 12, wherein, prior to forming said second masking layer, the method comprises performing an epitaxial deposition process to form additional semiconductor material on said third semiconductor material positioned in said source region of said device.

18. The method of claim 12, wherein said first semiconductor material defines a body having an axis that is substantially perpendicular to an upper surface of said substrate, said body having two side surfaces and an upper surface.

19. The method of claim 18, wherein said gate structure is positioned around said upper surface of said body and at least a portion of both of said side surfaces of said body.

20. A method of forming a tunneling field effect transistor device comprising a drain region, a source region, a gate region and a gate structure, the method comprising:
forming a first semiconductor material above a semiconductor substrate, said first semiconductor material being doped with a first type of dopant material, said first semiconductor material extending a full length of said drain region, said gate region and said source region;
forming a first masking layer that masks said drain region but exposes at least a portion of said gate region and exposes said source region;
with said first masking layer in position, forming a second semiconductor material above at least a portion of said gate region and above said source region;
with said first masking layer in position, forming a third semiconductor material above said second semiconductor material and above at least a portion of said gate region and above said source region, said third semiconductor material being doped with a second type of dopant material that is opposite to said first type of dopant material;
with said first masking layer in position, forming a second masking layer that masks said drain region but exposes at least a portion of said gate region; and
forming a replacement gate structure above at least a portion of said exposed gate region.

21. The method of claim 20, wherein said first semiconductor material, said second semiconductor material and said third semiconductor material are each comprised of a group III-V compound semiconductor material or a group IV material.

22. The method of claim 21, wherein said first semiconductor material, said second semiconductor material and said third semiconductor material are each made of different semiconductor materials.

23. The method of claim 20, wherein forming said first semiconductor material, forming said second semiconductor material and forming said third semiconductor material comprises performing three separate epitaxial deposition processes.

24. The method of claim 20, wherein forming said second semiconductor material comprises forming said second semiconductor material such that it extends substantially across the entire gate region in a direction that corresponds to a channel length direction of said device.

25. The method of claim 20, wherein forming said second semiconductor material comprises forming said second semiconductor material in an updoped condition.

26. The method of claim 20, wherein, prior to forming said second masking layer, the method comprises performing an epitaxial deposition process to form additional semiconductor material on said third semiconductor material positioned in said source region of said device.

27. The method of claim 20, wherein said first semiconductor material defines a body having an axis that is substantially perpendicular to an upper surface of said substrate, said body having two side surfaces and an upper surface.

28. The method of claim 27, wherein forming said gate structure comprises forming a gate structure that is positioned around said upper surface of said body and at least a portion of both of said side surfaces of said body.

\* \* \* \* \*